US009850655B2

(12) United States Patent
Matorić et al.

(10) Patent No.: US 9,850,655 B2
(45) Date of Patent: Dec. 26, 2017

(54) SYSTEM AND METHOD FOR MODULAR DATA CENTER

(71) Applicant: Liebert Corporation, Columbus, OH (US)

(72) Inventors: Ivan Matorić, Zagreb (HR); Goran Uzelac, Velika Gorica (HR); Denis Rančić, Samobor (HR); Mislav Crnogorac, Zagreb (HR)

(73) Assignee: Liebert Corporation, Columbus, OH (US)

(*) Notice: Subject to any disclaimer, the term of this patent is extended or adjusted under 35 U.S.C. 154(b) by 0 days.

(21) Appl. No.: 15/002,661

(22) Filed: Jan. 21, 2016

(65) Prior Publication Data

US 2016/0138260 A1 May 19, 2016

Related U.S. Application Data

(63) Continuation-in-part of application No. 14/504,081, filed on Oct. 1, 2014, now Pat. No. 9,572,288.
(Continued)

(51) Int. Cl.
*E04B 1/348* (2006.01)
*H05K 7/20* (2006.01)
(Continued)

(52) U.S. Cl.
CPC ...... *E04B 1/34807* (2013.01); *E04B 1/34869* (2013.01); *H05K 7/1497* (2013.01);
(Continued)

(58) Field of Classification Search
CPC .............. H05K 7/1497; E04B 1/34807; E04B 1/34869; Y10T 29/49
(Continued)

(56) References Cited

U.S. PATENT DOCUMENTS 2,677,580 A * 5/1954 Minzenmayer ........... E04G 1/20
182/129
4,170,852 A 10/1979 Danis, Jr.
(Continued)

FOREIGN PATENT DOCUMENTS

CN 201018612 Y 2/2008
CN 202110485 U 1/2012
(Continued)

OTHER PUBLICATIONS

International Search Report and Written Opinion of the International Searching Authority for PCT/US2016/036683 dated Sep. 22, 2016.

(Continued)

*Primary Examiner* — Tuan T Dinh
*Assistant Examiner* — Mukund G Patel
(74) *Attorney, Agent, or Firm* — Harness, Dickey & Pierce, P.L.C.

(57) ABSTRACT

A modular data center system is disclosed for constructing a modular data center building. A plurality of structural support columns are used to support a plurality of unit structures above a floor surface at a desired height relative to the floor surface. A pair of elongated support rails are also included which are coupled perpendicularly to the plurality of structural support columns, at approximately the desired height, to form two parallel, horizontally spaced apart tracks. Each of the unit structures includes a plurality of carriage assemblies, with each of the carriage assemblies including a wheel. The wheels allow the unit structures to be rolled horizontally into a desired position on the pair of elongated support rails when constructing the modular data center building to expedite its assembly.

20 Claims, 31 Drawing Sheets

Related U.S. Application Data

(60) Provisional application No. 61/886,402, filed on Oct. 3, 2013.

(51) Int. Cl.
*H05K 7/14* (2006.01)
*E04H 5/00* (2006.01)

(52) U.S. Cl.
CPC ... *H05K 7/20745* (2013.01); *E04H 2005/005* (2013.01); *Y10T 29/49* (2015.01)

(58) Field of Classification Search
USPC .................................... 361/679.46, 809, 810
See application file for complete search history.

(56) References Cited

U.S. PATENT DOCUMENTS

| | | | | |
|---|---|---|---|---|
| 5,524,776 | A * | 6/1996 | Hall | B65G 1/026 211/151 |
| 5,938,047 | A * | 8/1999 | Ellis | B65G 1/0442 211/1.57 |
| 7,269,753 | B2 | 9/2007 | Farkas et al. | |
| 7,278,273 | B1 | 10/2007 | Whitted | |
| 7,395,444 | B2 | 7/2008 | Ives | |
| 7,500,120 | B2 | 3/2009 | Egan et al. | |
| 7,917,792 | B2 | 3/2011 | Brech et al. | |
| 8,072,780 | B1 | 12/2011 | Roy | |
| 8,180,495 | B1 | 5/2012 | Roy | |
| 8,320,125 | B1 | 11/2012 | Hamburgen et al. | |
| 8,456,840 | B1 | 6/2013 | Clidaras et al. | |
| 8,469,782 | B1 | 6/2013 | Roy | |
| 8,523,643 | B1 | 9/2013 | Roy | |
| 8,888,158 | B2 | 11/2014 | Slessman | |
| 8,893,813 | B2 | 11/2014 | Kochelek et al. | |
| 9,198,331 | B2 | 11/2015 | Roy | |
| 9,622,389 | B1 | 4/2017 | Roy | |
| 9,670,689 | B2 | 6/2017 | Dechene et al. | |
| 2008/0135691 | A1 | 6/2008 | Buck | |
| 2008/0277391 | A1 | 11/2008 | Ciccaglione | |
| 2009/0129016 | A1 | 5/2009 | Hoeft et al. | |
| 2009/0287943 | A1 | 11/2009 | Brey et al. | |
| 2009/0287949 | A1 | 11/2009 | Bradicich et al. | |
| 2010/0235206 | A1 | 9/2010 | Miller et al. | |
| 2010/0315775 | A1* | 12/2010 | Grantham | H05K 7/20745 361/688 |
| 2011/0083824 | A1 | 4/2011 | Rogers | |
| 2011/0108207 | A1 | 5/2011 | Mainers | |
| 2011/0307102 | A1 | 12/2011 | Czamara | |
| 2012/0125028 | A1 | 5/2012 | Keisling et al. | |
| 2012/0147552 | A1 | 6/2012 | Driggers | |
| 2012/0300391 | A1 | 11/2012 | Keisling | |
| 2013/0040547 | A1 | 2/2013 | Moore | |
| 2013/0199032 | A1 | 8/2013 | Czamara et al. | |
| 2014/0099873 | A1 | 4/2014 | Ruiz et al. | |
| 2014/0157692 | A1 | 6/2014 | Parizeau et al. | |
| 2017/0086333 | A1 | 3/2017 | Roy | |

FOREIGN PATENT DOCUMENTS

| | | | |
|---|---|---|---|
| GB | 2467808 | A | 8/2010 |
| JP | H04-101218 | U | 9/1992 |
| JP | 2011-133129 | A | 7/2011 |
| JP | 2012-199300 | A | 10/2012 |
| JP | 5084964 | B1 | 11/2012 |
| WO | 2011038348 | A1 | 3/2011 |
| WO | 2012118554 | A1 | 9/2012 |
| WO | 2013114528 | A1 | 8/2013 |
| WO | 2014/039524 | A2 | 3/2014 |

OTHER PUBLICATIONS

International Search Report and Written Opinion of the International Searching Authority for PCT/US2014/058771 dated Feb. 2, 2015.

Japanese Patent Application No. 2016-519809 dated Jun. 6, 2017, 15 Pages.

First Office Action and Search Report issued by the State Intellectual Property Office in corresponding China Patent Application No. 2014800543735 dated May 8, 2017, 21 pages.

* cited by examiner

SYSTEM AND METHOD FOR MODULAR DATA CENTER

CROSS-REFERENCE TO RELATED APPLICATIONS

This application is a continuation-in-part application of U.S. Non-Provisional application Ser. No. 14/504,081, filed Oct. 1, 2014, which claims the benefit of U.S. Provisional Application No. 61/886,402, filed on Oct. 3, 2013. The entire disclosure of both of the above applications are incorporated herein by reference.

FIELD

The present disclosure relates to data center systems and methods for constructing data centers, and more particularly to a modular, pre-fabricated data center structure that makes use of a plurality of carriage assemblies associated with each one of a plurality of unit structures, and wherein the carriage assemblies allow each unit structure to be wheeled into position along a pair of elevated support rails when assembling a data center building to thus expedite the assembly of the data center building.

BACKGROUND

The statements in this section merely provide background information related to the present disclosure and may not constitute prior art.

As data center needs increase world-wide, there has been increasing interest in finding more cost effective ways to set up and construct data centers. Additional concerns are consistent quality of the data center components and the time required to construct the data center. These concerns are especially relevant when constructing data centers in countries other than the United States. Traditionally data centers have been constructed in "stick building" fashion completely at the selected data center site. This involves bringing all the raw materials out to the data center site, using large numbers of construction workers such as electrical contractors, welders, building construction workers and other skilled tradesmen to construct the data center structure from the raw materials shipped to the site. As will be appreciated, this construction approach can be quite costly. Maintaining quality of the finished data center structure can sometimes be challenging, typically requiring numerous inspections by various individuals as the construction process is on-going. Construction delays may be encountered when specific subcomponents or raw materials being used to construct the data center are not received at the building site according to the planned construction timetable. The need to separately ship independent building components (steel, cable trays, wall panels, etc.) to the site can also contribute significantly to the overall high cost of constructing a data center. Seasonal weather changes and delays brought on by inclement weather can also result in a lengthy and costly construction timeline for a data center structure.

Additional concerns with data centers are the ability to easily and cost-effectively expand the data center as needs grow. With conventional data center structures that have been constructed using the "stick build" approach, expansion can sometimes be expensive and particularly time consuming.

Accordingly, there is strong interest in reducing the cost of a data center structure as well as the time needed for its construction. Significantly reducing the overall construction cost of a data center structure and the time required to get a new data center up and running may make it feasible to set up data centers in various parts of the world where the cost of constructing a data center with the conventional "stick build" approach would make the endeavor cost prohibitive.

SUMMARY

In one aspect the present disclosure relates to a modular data center system. The modular data center system may comprise a plurality of unit structures for channeling at least one of cold air or hot air from data center components located within the modular data center system when the modular data center system is fully assembled to form a modular data center building. A plurality of structural support columns support the plurality of unit structures above a floor surface at a desired height relative to the floor surface. A pair of elongated support rails are also included which are coupled perpendicularly to the plurality of structural support columns, at approximately the desired height, to form two parallel, horizontally spaced apart tracks. Each of the unit structures includes a plurality of carriage assemblies, with each of the carriage assemblies including a wheel. The wheel of each one of the carriage assemblies allows the unit structures to be rolled horizontally into a desired position on the pair of elongated support rails when constructing a modular data center building to expedite assembly of the modular data center building.

In another aspect the present disclosure relates to a modular data center system including a plurality of unit structures for channeling at least one of cold air or hot air from data center components located within the modular data center system when the modular data center system is fully assembled. The system may include a plurality of structural support columns for supporting the plurality of unit structures above a floor surface at a desired height relative to the floor surface. A pair of elongated support rails may be included. The elongated support rails may be coupled perpendicularly to the plurality of structural support columns at approximately the desired height to form two parallel, horizontally spaced apart tracks. Each unit structure may include a plurality of carriage assemblies. Each carriage assembly may include a wheel and is configured such that the wheels of the carriage assemblies are positioned adjacent each one of four corners of the unit structure. The wheels of the carriage assemblies enable the unit structures to be rolled horizontally into a desired position on the pair of elongated support rails when constructing a modular data center building.

In still another aspect the present disclosure relates to a method for forming a modular data center. The method may comprise providing a plurality of unit structures for channeling at least one of cold air or hot air from data center components located within the modular data center when the modular data center is fully assembled. The method may also comprise using a plurality of first structural support columns for supporting the plurality of unit structures above a floor surface at a desired height relative to the floor surface. A pair of elongated support rails may also be used which are coupled perpendicularly to the plurality of first structural support columns at approximately the desired height to form two parallel, horizontally spaced apart tracks. The method may also involve using a plurality of carriage assemblies, with each of the carriage assemblies including a wheel, to support each of the unit structures on the elongated support rails. The method may include using the wheels of the carriage assemblies to horizontally roll each of the unit structures along the elongated support rails into a desired position on the pair of elongated support rails when constructing the modular data center.

BRIEF DESCRIPTION OF THE DRAWINGS

The drawings described herein are for illustration purposes only and are not intended to limit the scope of the present disclosure in any way. In the drawings.

DETAILED DESCRIPTION

Figure 1:
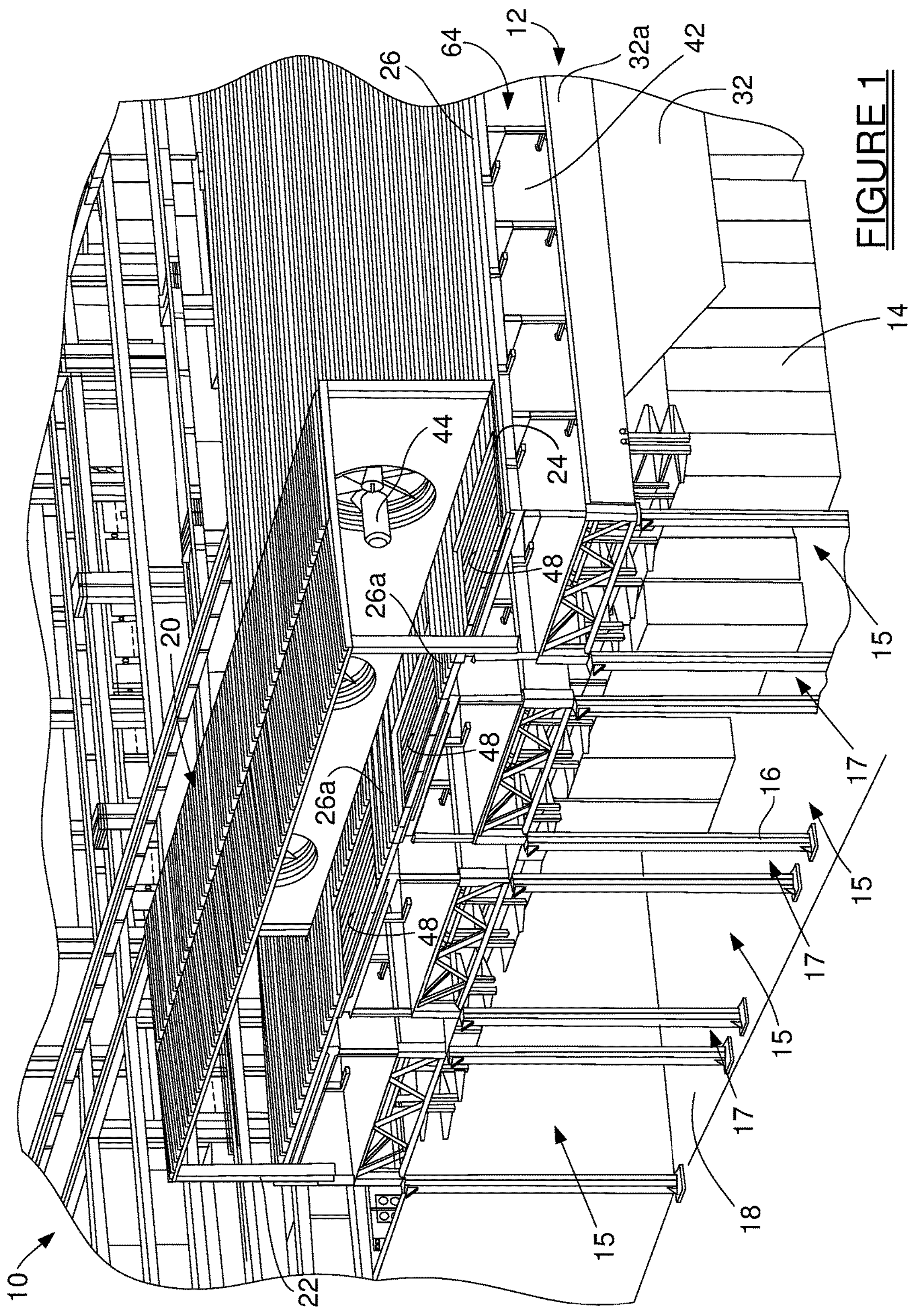
FIG. 1 is a perspective illustration of a plurality of modular, collapsible data center unit structures disposed adjacent one another to help form a data center, in accordance with one embodiment of the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1 there is shown a portion of a modular data center facility 10 incorporating a plurality of modular, collapsible data center unit structures 12 (hereinafter simply "unit structures 12") for forming a rapidly deployable data center. Each of the unit structures 12 forms an elongated structure which may be used to channel both cold air from one or more air conditioning systems through a cold aisle 15 which separates parallel rows of equipment racks 14, as well to help channel hot air from a hot aisle. Each unit structure 12 is adapted to be supported by structural support columns 16 at a predetermined height above a floor 18 of the data center facility 10. FIG. 1 illustrates a plurality of the unit structures 12 positioned in side-by-side fashion. Adjacent ones of the unit structures 12 are further spaced apart a predetermined distance. This spacing forms hot aisles 17 between adjacent ones of the unit structures 12.

With further reference to FIG. 1, the modular data center facility 10 may also include one or more modular penthouse exhaust structures 20 for receiving hot air from the hot aisles 17 and exhausting the hot air from the modular data center facility 10. The modular penthouse exhaust structures 20 receive the hot air flow from the hot aisles 17 through openings 24 in ceiling panels 26 of the unit structures 12. This feature will be explained in greater detail in the following paragraphs. A plurality of bridging ceiling panels 26*a* are also used to bridge the spacing between adjacent ones of the unit structures 12, and thus ensure that hot air being drawn out from the hot aisles 17 is exhausted through the openings 24.

Figure 2:
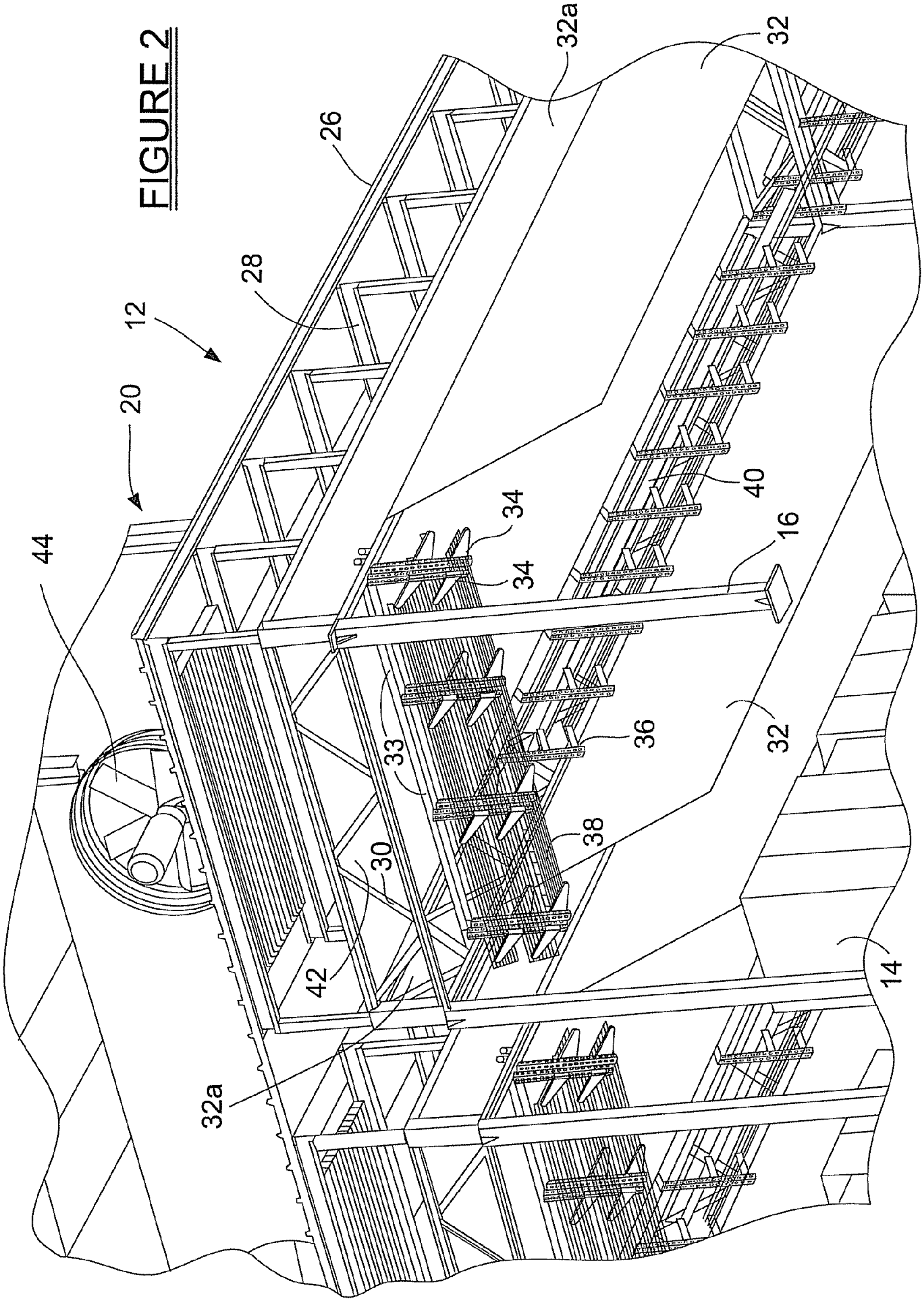
FIG. 2 is an enlarged perspective view of a portion of one of the data center unit structures of the present disclosure even more fully illustrating a plurality of foldable cable tray supports, along with one cable tray, that each unit structure incorporates.

Referring to FIG. 2, one of the unit structures 12 is shown in greater detail. In addition to the ceiling panel 26, each unit structure 12 has a frame structure 28 that supports a plurality of the ceiling panels 26 to form a roof-like structure. A perimeter frame structure 30 may be coupled to the structural support columns 16. The perimeter frame structure 30 may be used to support collapsible (i.e., foldable) panels 32 to help maintain cold air from air conditioning systems within the cold aisles 15 between adjacent rows of equipment racks 14. The perimeter frame structure 30 also may include a plurality of pivotally secured hangers 34 and 36 that are supported from the frame structure 30. Hangers 34 in this example are supported from separate cross members 33 and are able to pivot into the orientation shown in FIG. 2 for use. Hangers 34 may have a plurality of cable trays 38 secured thereto and hangers 36 may likewise have a plurality of cable trays 40 secured thereto. Cable trays 38 and 40 may be used to support a variety of different types of cables such as network cables, power cables, etc., that need to be routed through the data center facility 10 to equipment components mounted in the rows of equipment racks 14. A roof panel 42 may also be secured to the perimeter frame structure 30. Roof panel 42 forms a partition which further helps to channel cold air from one or more air conditioning systems through the cold aisle 15 formed between adjacent rows of equipment racks 14.

Figure 2A:
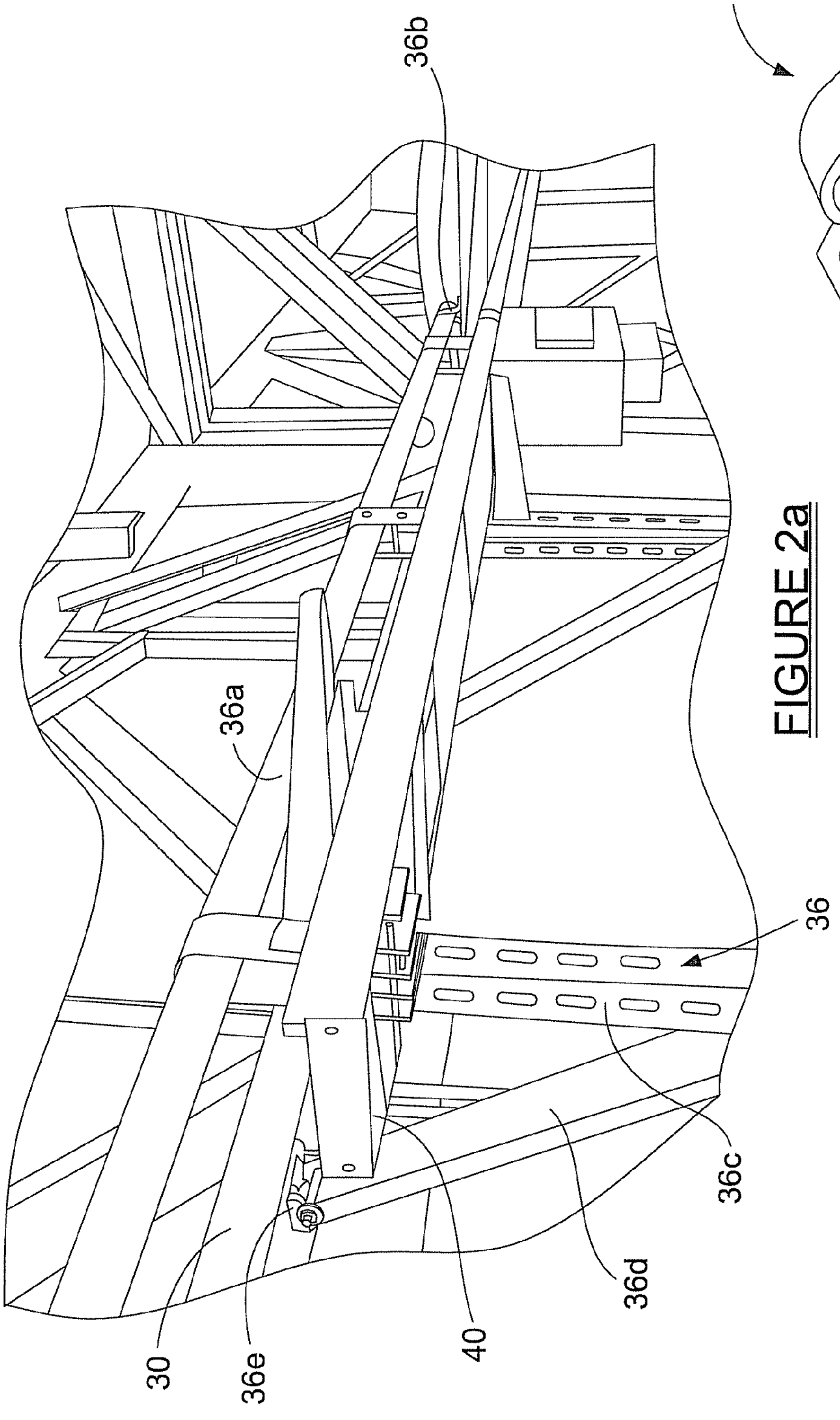
FIG. 2*a* is a perspective view of a portion of one form of pivoting mechanism that may be used to support the hangers, which involves the use of an elongated tubular support member which is able to rotate.
Figure 2B:
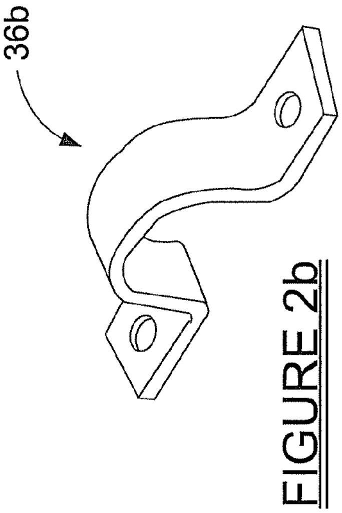
FIG. 2*b* is an enlarged perspective view of the saddle-like strap shown in FIG. 2*a* which may be used to help enable rotational movement of the elongated tubular support member shown in FIG. 2*a;*

With brief reference to FIG. 2*a*, a portion of one of the hangers 36 is shown. The hanger 36 may be representative of, or identical, to the construction used for the hangers 34. The ability of the hanger 36 to pivot is achieved, in one example, by using a round, rigid, tubular, elongated support member 36*a*, which may be supported for rotational movement at its opposing ends by a saddle-like bracket 36*b*, where the saddle-like bracket 36*b* is fixedly secured to a portion of the perimeter frame structure 30 by suitable fasteners (not shown). The saddle like bracket 36*b* is also shown in FIG. 2*b*. Of course any other suitable hinge or hinge-like structures could be implemented to enable pivoting motion of the hanger 36.

FIG. 2*a* also shows that the hanger 36 may include a plurality of depending structural members 36*c* which may support the cable trays 40. The depending structural members 36*c* may be fixedly secured to the elongated support member 36*a* so as to be able to rotate with the elongated support member 36*a*, and thus be able to present the trays 40 in an operative position below the perimeter frame structure 30 or in a stowed orientation. One or more braces 36*d* may be used to brace the hanger 36 in its operative position. The braces 36*d* may each be secured at one end to the perimeter frame structure 30 by suitable brackets 36*e* that enable pivoting motion thereof, and at their opposite ends to the depending structural members 36*c*. This enables the braces 36*d* to be pivoted upwardly into stowed configurations once detached from the structural members 36*c*. Still, the braces 36*d* are able to be quickly and easily secured to the structural members 36*c* of the hanger 36, to brace the hanger 36 once the hanger 36 is lowered into its operative position. It will also be appreciated that the hangers 36, as well as the hangers 34, may be constructed from suitable structural supports and brackets to permit their easy removal from the perimeter frame structure 30, instead of a folding motion. Depending on how many cable trays 38 and 40 are employed, and the overall dimensions of the unit structure 12, it may be helpful or necessary to have the hangers 34 and or 36 supported by structure that is removable completely from the perimeter frame structure 30 when the unit structure is prepared for shipping.

Figure 6:
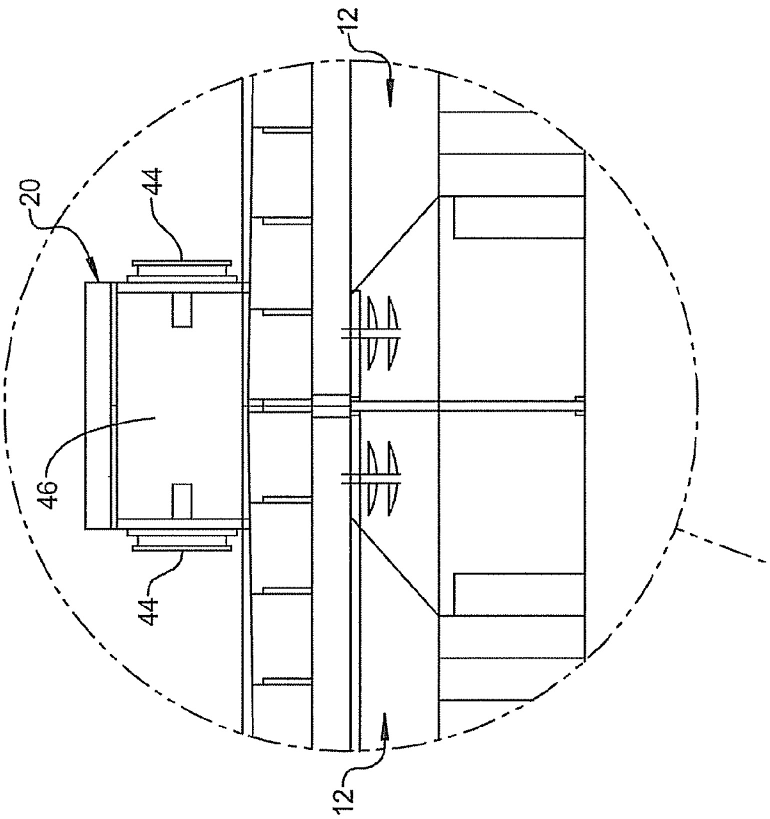
FIG. 6 is an enlarged view of just circled portion 6 in FIG. 5.
Figure 5:
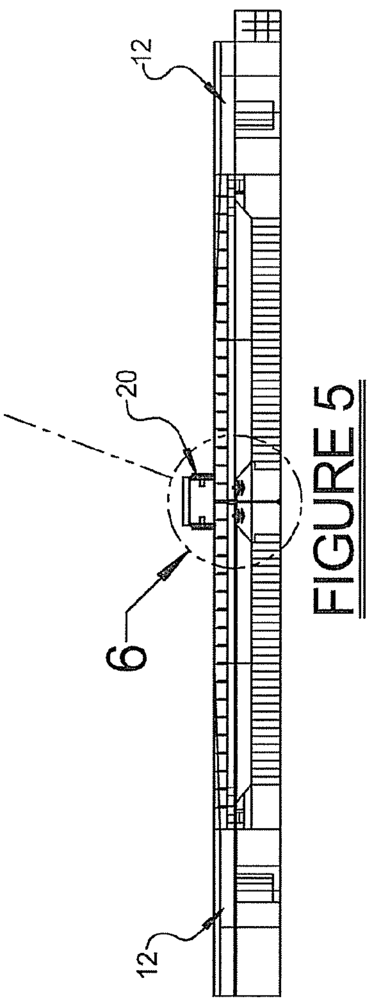
FIG. 5 is a high level side view of a portion of a data center in which two of the data center unit structures are shown forming an elongated row, and further illustrating a modular penthouse exhaust structure that resides above the data center unit structures to facilitate the exhaust of hot air from hot air isles formed between rows of equipment racks positioned underneath the unit structures.
Figure 6A:
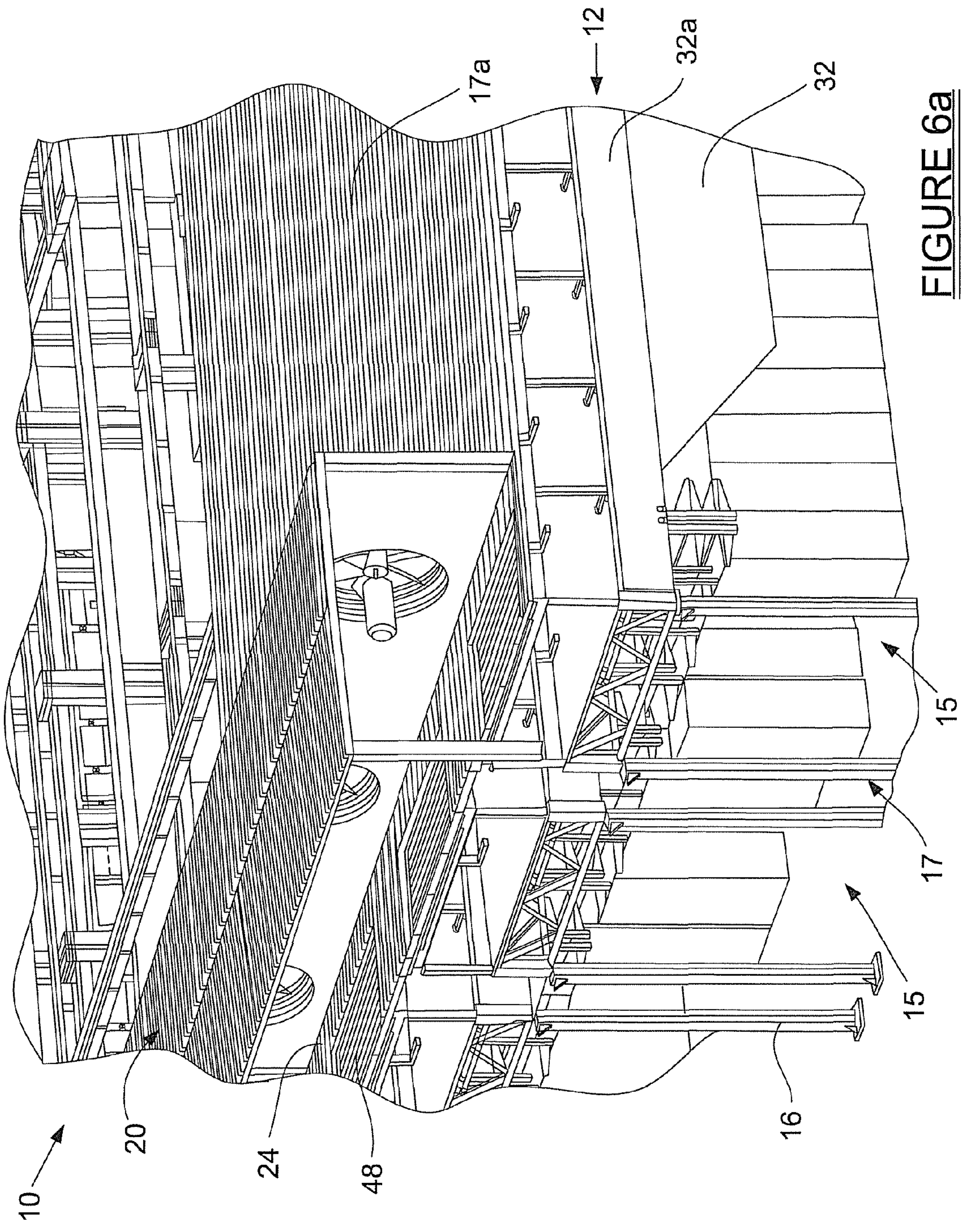
FIG. 6*a* is a perspective view of a portion of one end of the data center illustrating how hot air from a hot air isle may be exhausted through the modular penthouse exhaust structure.

With reference to FIGS. 5, 6 and 6*a*, one of the modular penthouse exhaust structures 20 is shown from one end thereof. It will be appreciated that, in practice, a plurality of the modular penthouse exhaust structures 20 will be used to form an elongated channel 46 into which hot air 17*a* from the hot aisles 17 may be drawn into with the assistance of a plurality of opposing exhaust fans 44. In one embodiment each modular penthouse exhaust structure 20 may include a total of six exhaust fans 44 arranged as two opposing rows of three fans. With further reference to FIG. 1, the openings 24 in the ceiling panels 26 may also have positioned therein modulated louver assemblies 48 that may be electronically modulated to tailor the flow of hot air from the hot aisles 17 that may be drawn into the penthouse exhaust structures 20. Suitable air flow and/or temperature control monitoring systems (not shown) may be provided for this purpose.

Figure 3:
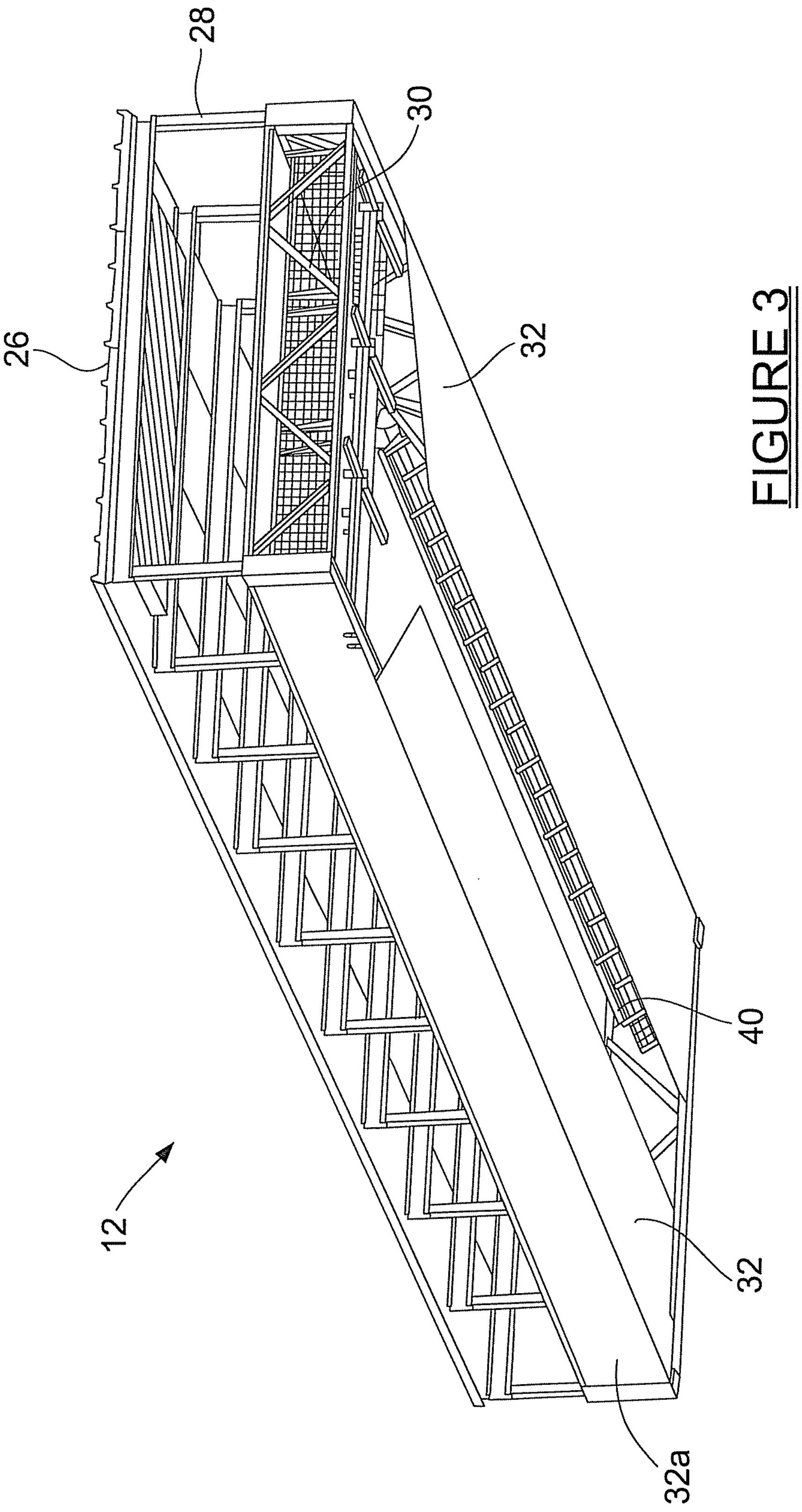
FIG. 3 is a perspective view of one of the data center unit structures shown in FIG. 1 but with the unit structure in its collapsed configuration for shipping.
Figure 4:
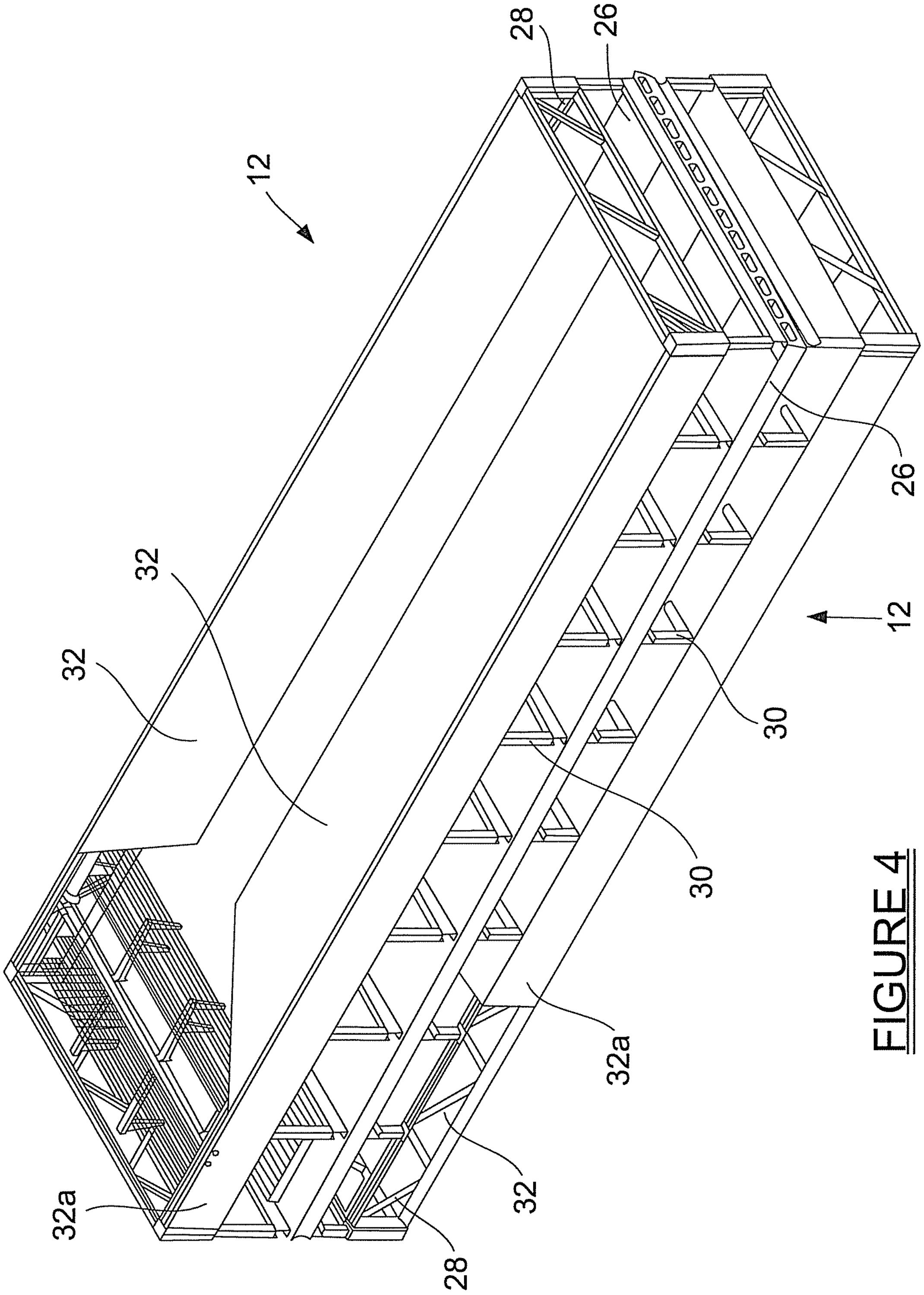
FIG. 4 is a perspective view of two data center unit structures in their collapsed configurations and positioned back-to-back, which forms a highly compact package suitable for placement in a standard shipping container.

Referring to FIG. 3, one of the unit structures 12 is shown in its collapsed configuration. The unit structure 12 has the hangers 34 and 36 pivoted into a stowed position where they are held such that they do not protrude below panel portions 32*a* of panels 32. Panels 32 are also pivoted such that they extend parallel to the ceiling panels 26. In the collapsed configuration the unit structure 12 forms an elongated, relatively narrow configuration with the hangers 34 and 36, as well as the cable trays 38 and 40, tucked up between the panel portions 32*a*. This configuration also forms a highly space efficient configuration from a shipping and packaging standpoint. Any suitable locking structure may be used in connection with the panels 32 to hold the panels 32 in their collapsed configuration, such as elongated structural beams (not shown) that may be physically connected to select portions of the panels 32 and the perimeter frame structure 30. FIG. 4 illustrates a pair of the unit structures 12 in their collapsed configurations positioned back-to-back. Each of the unit structures 12, when in its collapsed configuration, may have dimensions of approximately 12192 mm (40.0 feet) in overall length by 3658 mm (12.0 feet) in width and 2848 mm (5 feet and 5.22 inches) in height. The back-to-back positioned pair of unit structures 12 in FIG. 4 may have overall dimensions of about 12192 mm (40 feet) in length, 3658 mm (12 feet) in width and 2848 mm (9 feet and 4.13 inches) in overall height. The collapsed configuration enables a pair of the unit structures 12 to be efficiently packaged for shipping.

Figure 7:
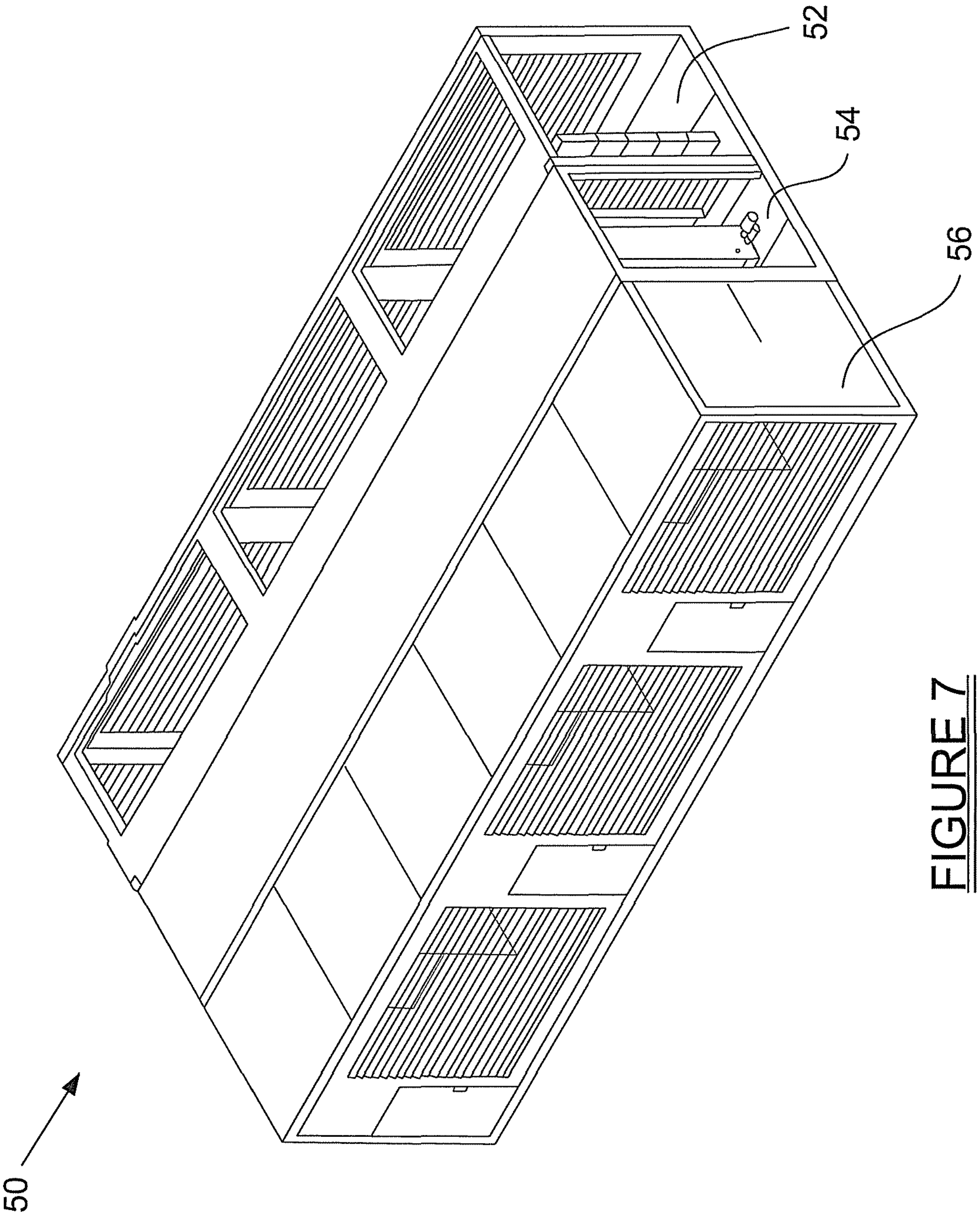
FIG. 7 is a perspective view of modular cooling unit that may be used with the data center unit structures to help form a modular data center.

FIG. 7 illustrates a modular cooling unit 50 that may be used to help form the modular data center facility 10 of FIG. 1. It will be noted that the modular cooling unit 50 may have dimensions of about 13761 mm (45 feet) in length, about 7315 mm (24 feet) in width and about 3500 mm (11 feet and 5.8 inches) in overall height. As such, the cooling module unit 50 is very similar in overall dimensions to the back-to-back pair of unit structures 12 shown in FIG. 4, which again facilitates shipping in a standardized shipping container.

Figure 8:
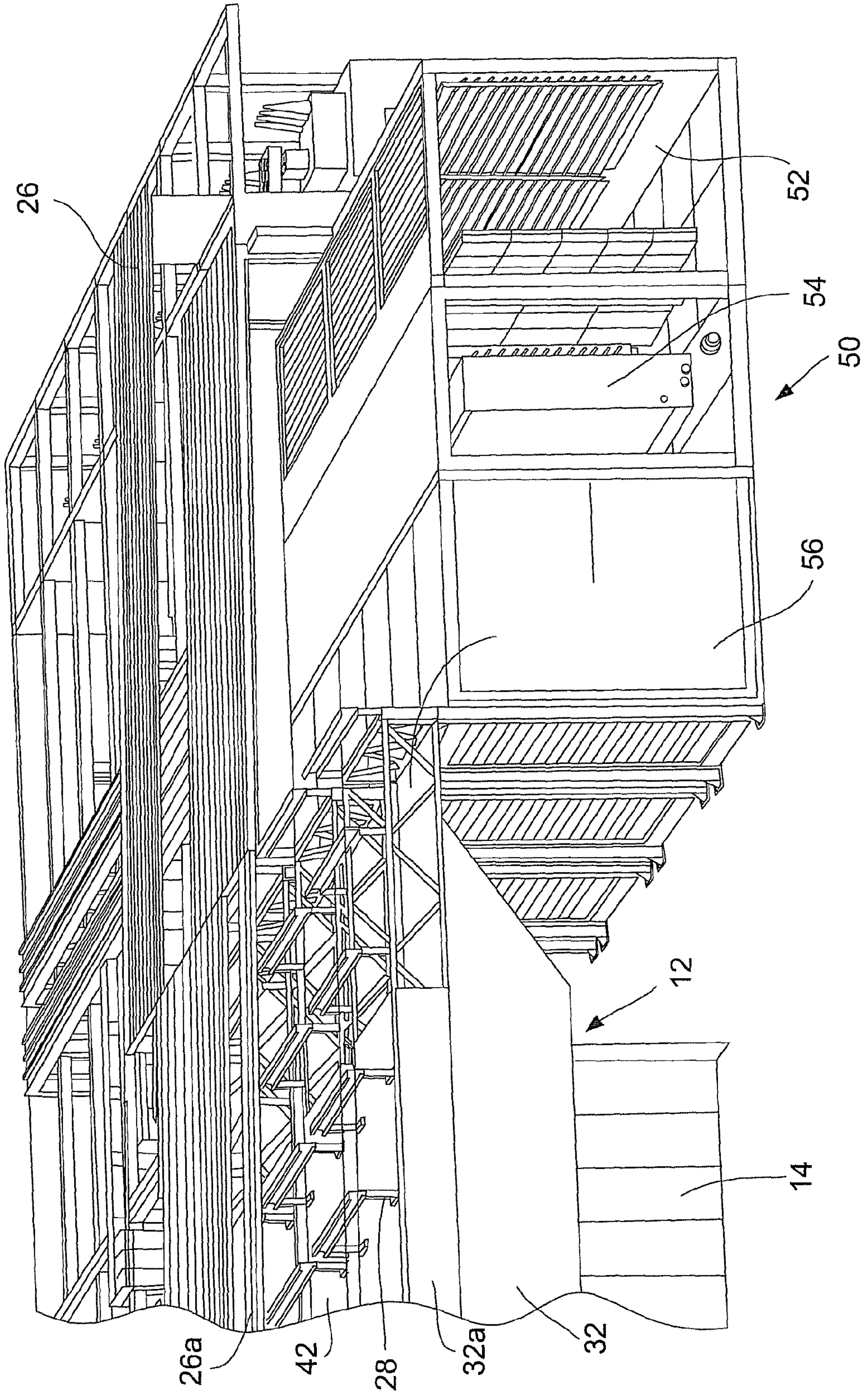
FIG. 8 shows a perspective view of one of the modular cooling units arranged adjacent the ends of a plurality of the data center unit structures.

In FIG. 8 one modular cooling unit 50 can be seen arranged so that its major length extends perpendicular to the major length of the unit structures 12, and such that it is positioned adjacent one of the ends of the unit structures 12. This enables the modular cooling unit 50 to supply cold air to the cold aisles 15 formed by a plurality of the unit structures 12.

Figure 9:
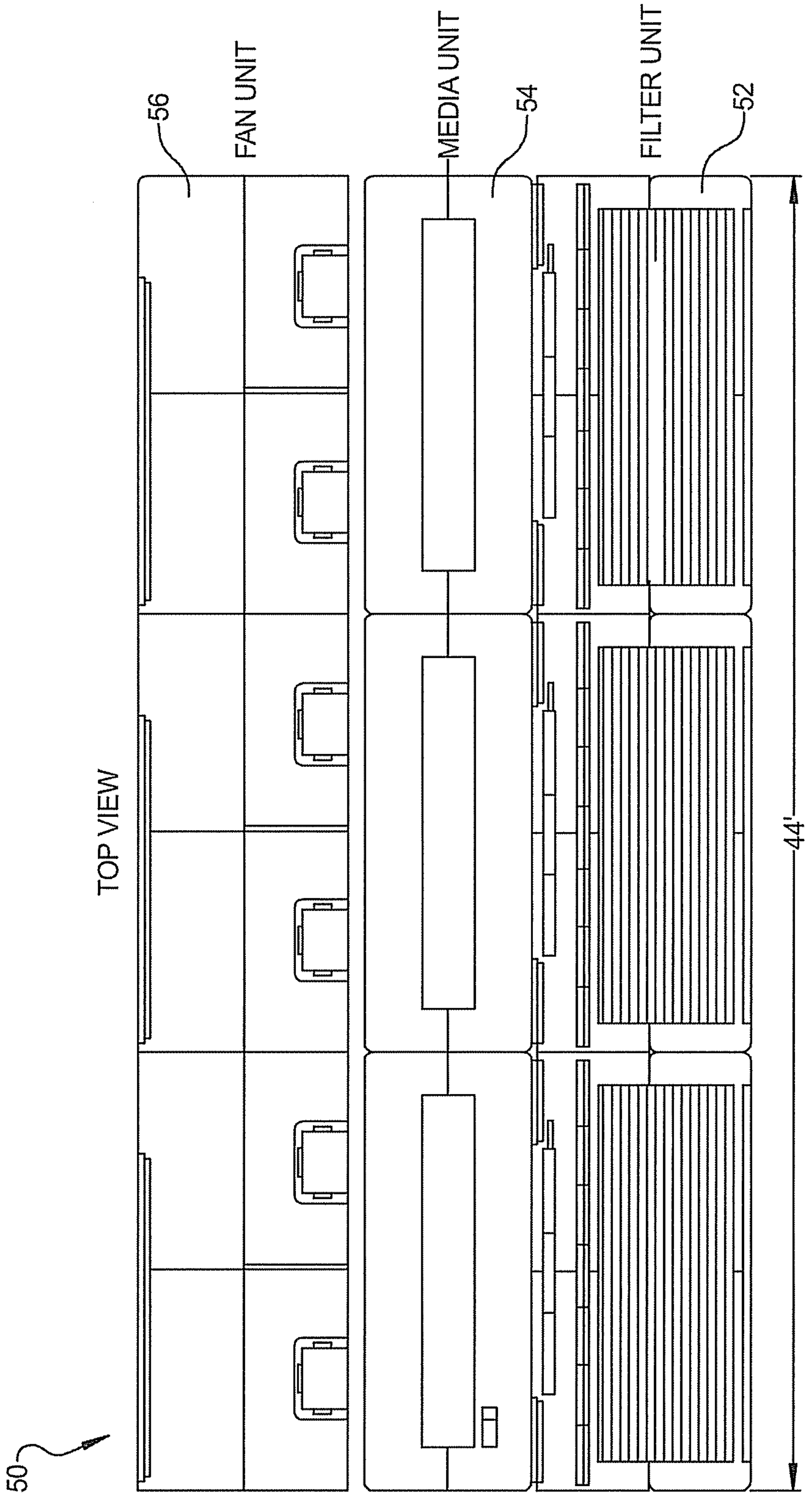
FIG. 9 is a high level top view illustrating the components of the modular cooling unit shown in FIG. 7.
Figure 10:
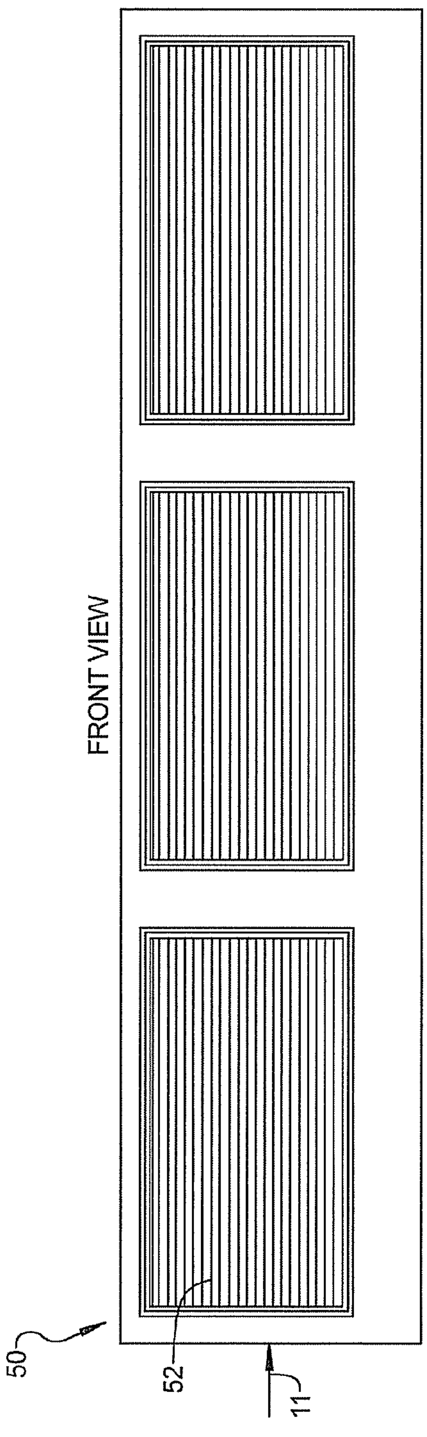
FIG. 10 is a high level front view of the modular cooling unit of FIG. 9.
Figure 11:
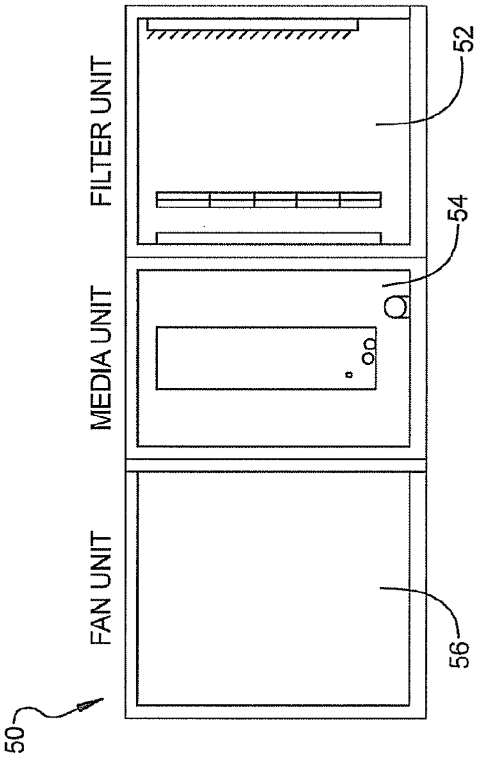
FIG. 11 is a high level side view of the cooling unit of FIG. 9 in accordance with arrow 11 in FIG. 10.
Figure 12:
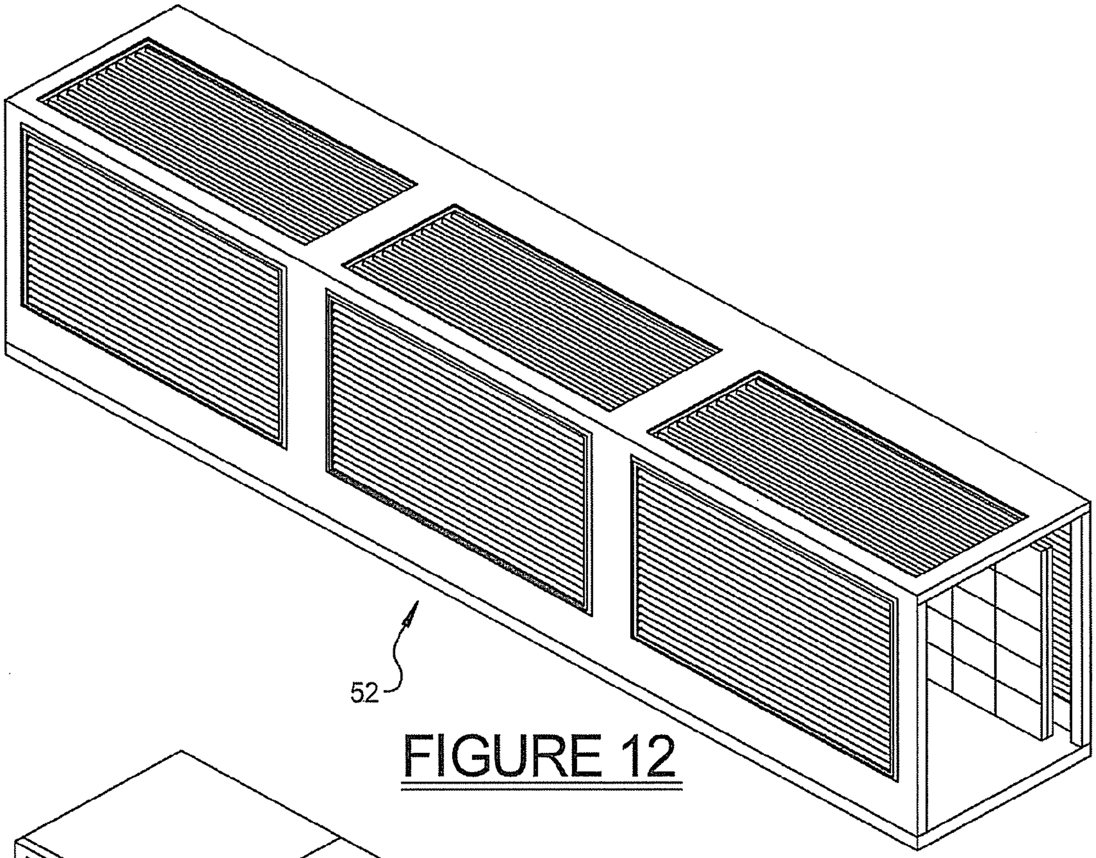
FIG. 12 is a high level perspective view of just a filter unit of the modular cooling unit.
Figure 13:
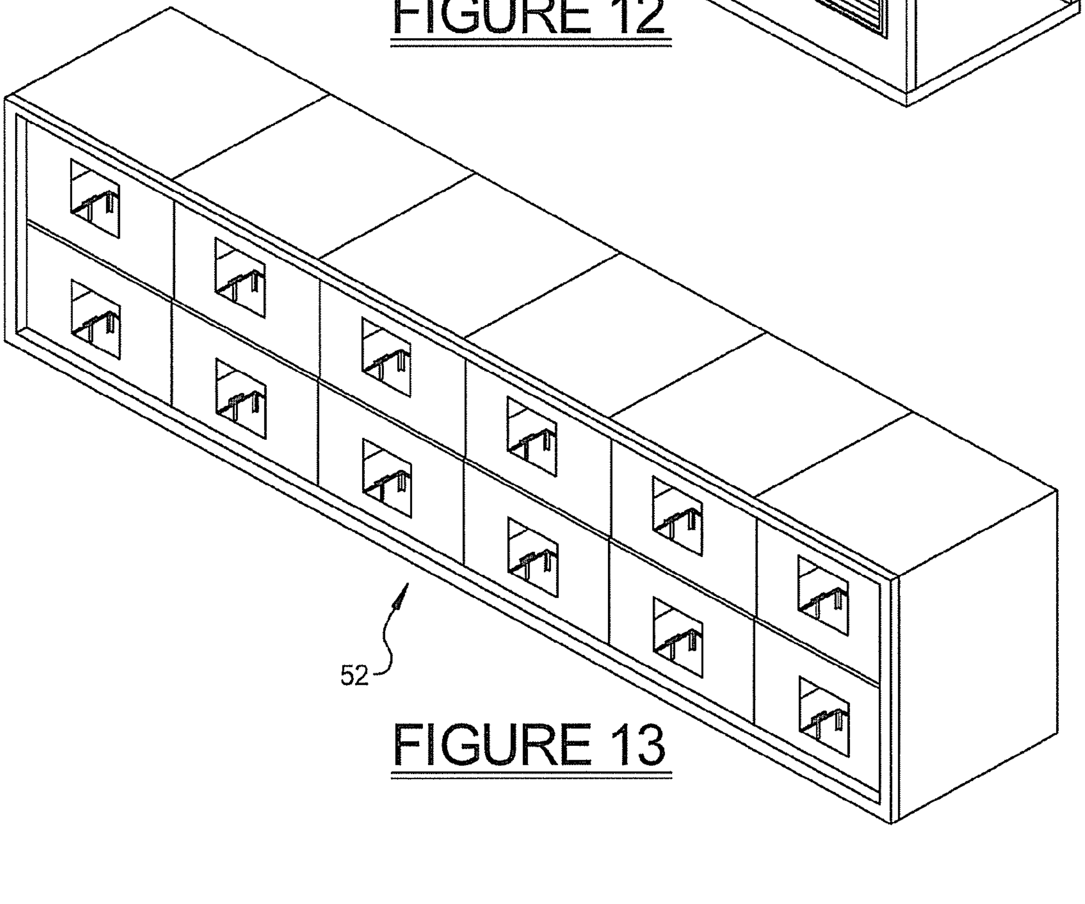
FIG. 13 is a high level perspective view of just a fan unit of the modular cooling unit.
Figure 14:
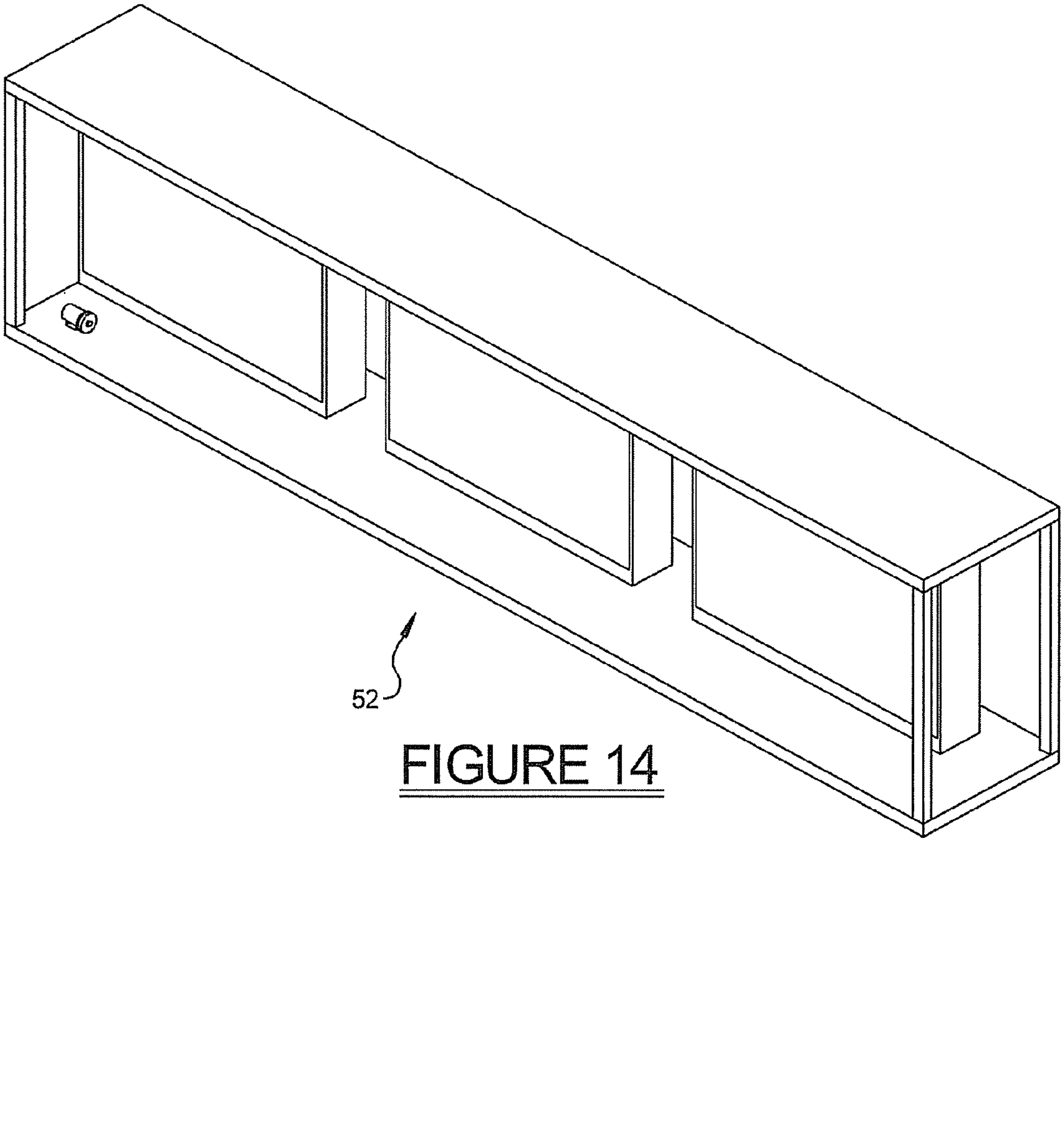
FIG. 14 is a high level perspective view of just a cooling module media unit of the modular cooling unit.
Figure 15:
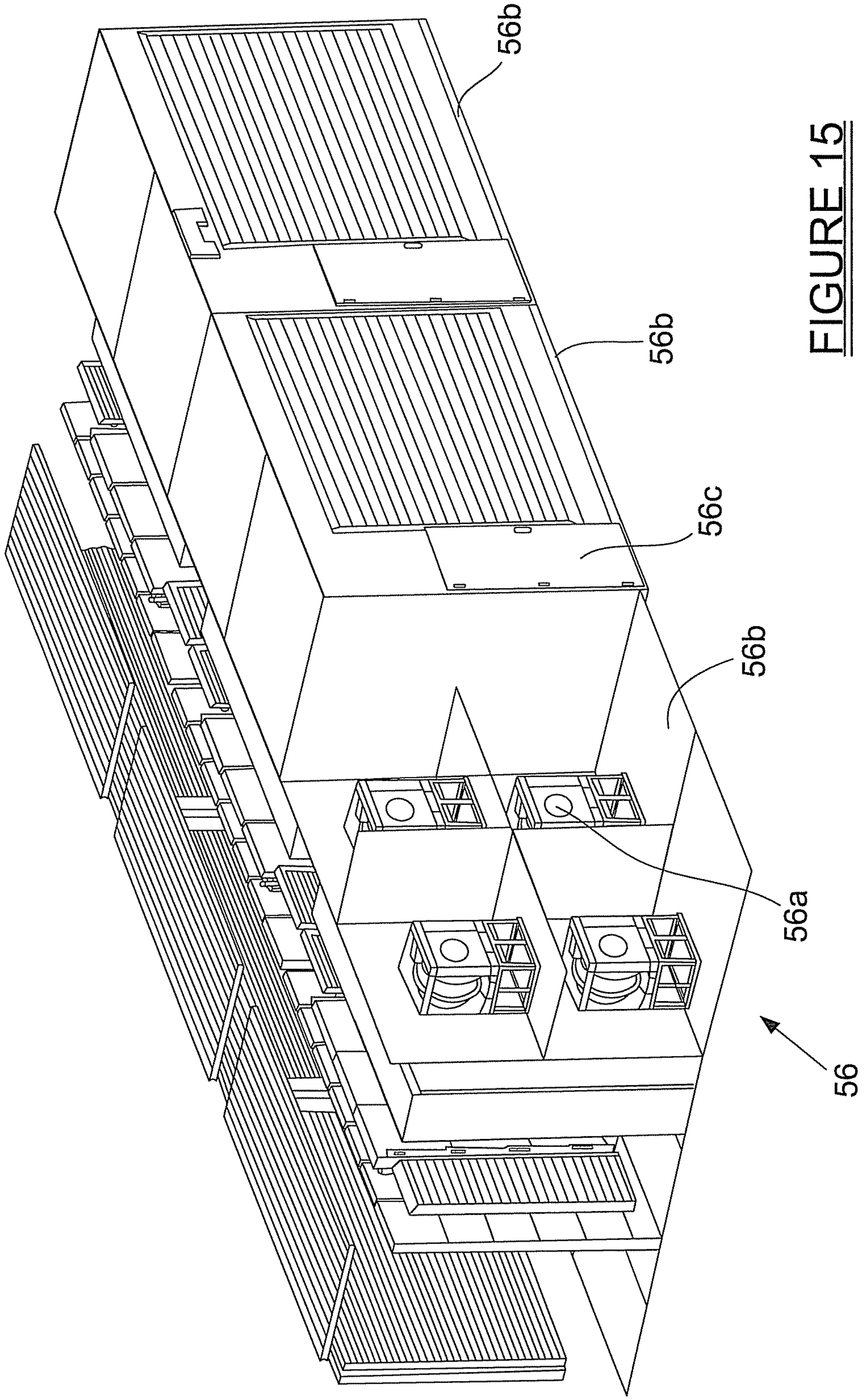
FIG. 15 is another high level perspective view of the modular cooling unit but with its outer wall structure removed, and further with the wall structure surrounding one of the fan units removed.

With reference to FIGS. 9-11, each modular cooling unit 50, in one embodiment, may form an evaporative (i.e., adiabatic) cooling unit that includes a filter unit 52, a media unit 54, a fan unit 56, and may draw on the order of 900 kW. FIGS. 12-14 further illustrate these components. Each fan unit 56 may include a plurality of fans **56*a*, and in one embodiment a total of twelve such fans 56*a* configured in three separate cabinets 56*b* as shown in FIG. 15. FIG. 15 further illustrates that the cabinets 56*b* each may have an isolated access through a door 56*c***.

Figure 16:
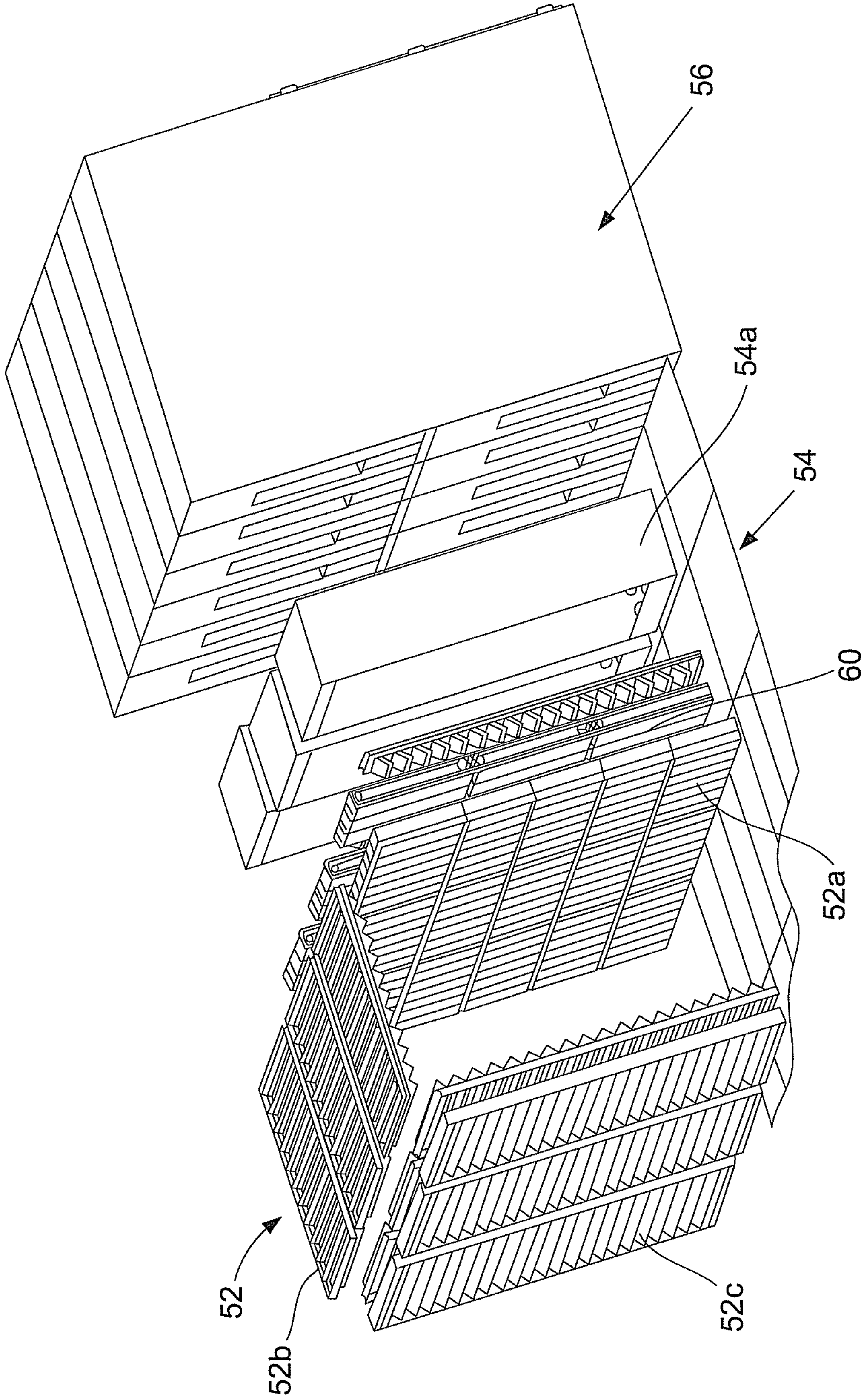
FIG. 16 further illustrates components that may be included within each of the modular cooling units.
Figure 17:
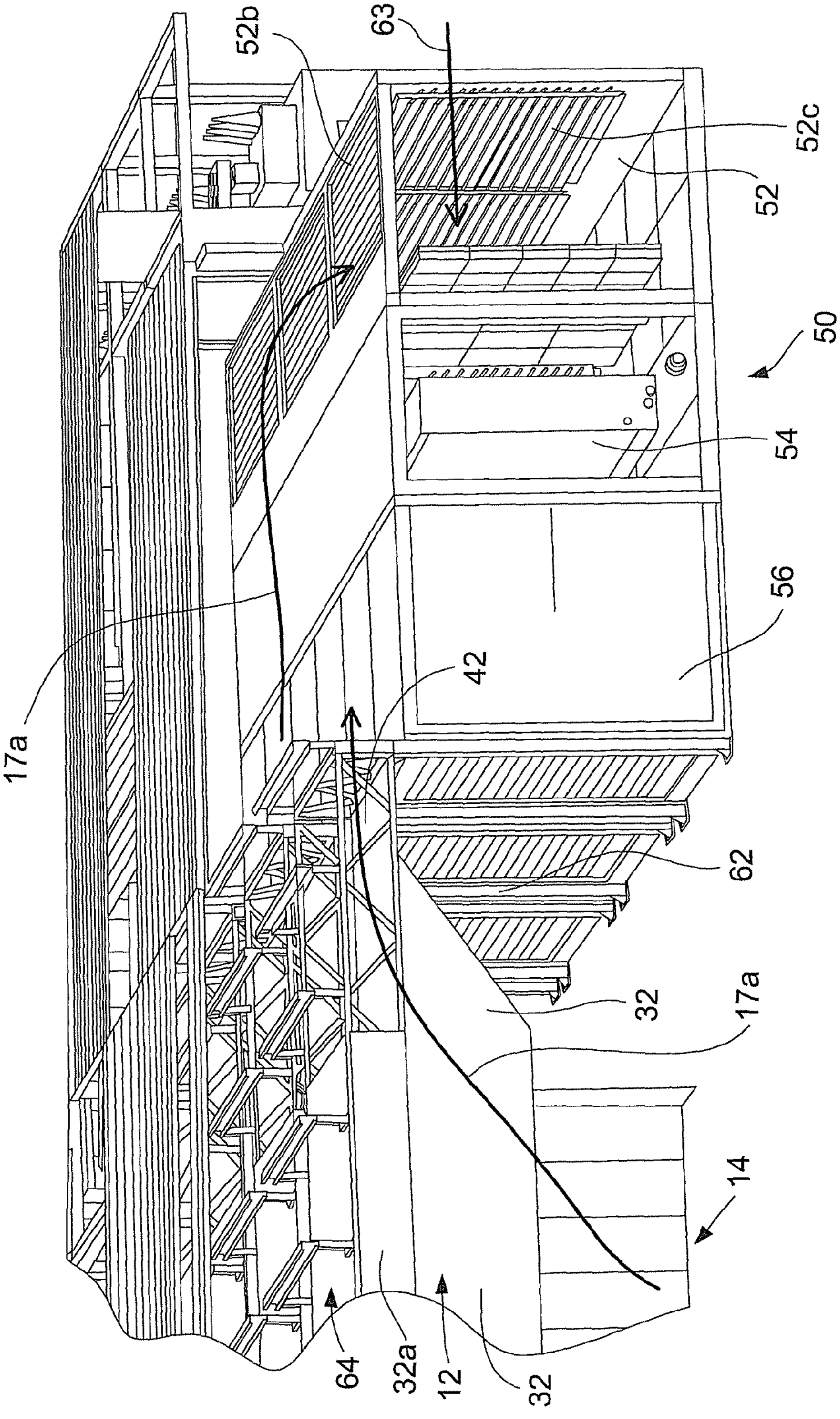
FIG. 17 is a perspective view of one modular cooling unit located adjacent to a plurality of the data center unit structures illustrating how hot exhaust (i.e., return) air from one of the hot isles may be returned to the modular cooling unit.

FIG. 16 illustrates that the media unit 54 may include three independent evaporative cooling modules **54*a*-54*c* having four cooling stages each. A DX coil and dampers 60 may optionally be included. The filter unit 52 may include a plurality of filters 52*a*, an electronically actuated return air damper 52*b* for controlling a return air flow into the modular cooling unit 50, and an electronically actuated outside air louver and damper 52*c* for controlling the flow of outside (ambient air) drawn into the modular cooling unit 50. FIG. 17 illustrates how hot air 17*a* in the hot aisles 17 may be returned within an area 64 formed between the ceiling panels 26, the bridging ceiling panels 26*a*, and the roof panels 42 of the unit structures 12 as "return" air through the return air dampers 52*b* to the modular cooling unit 50. Cool air 62 is supplied into each of the cold aisles 15 by the modular cooling units 50, which are able to draw in outside air 63**.

Figure 18:
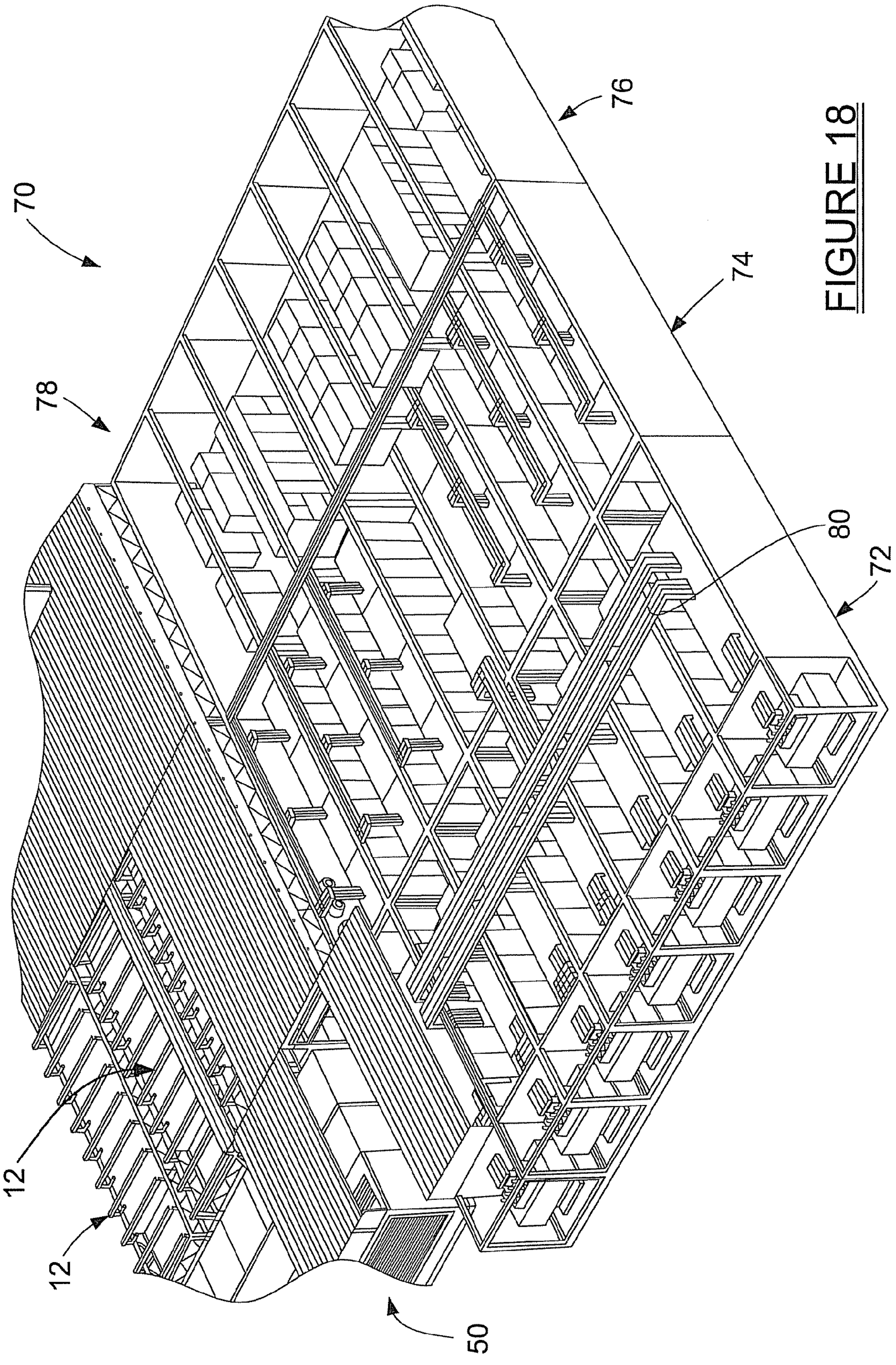
FIG. 18 is a high level overhead view of a portion of a data center illustrating a plurality of modular sections that together form a "power hall" for a data center, and which are located adjacent to a plurality of the data center unit structures.
Figure 19:
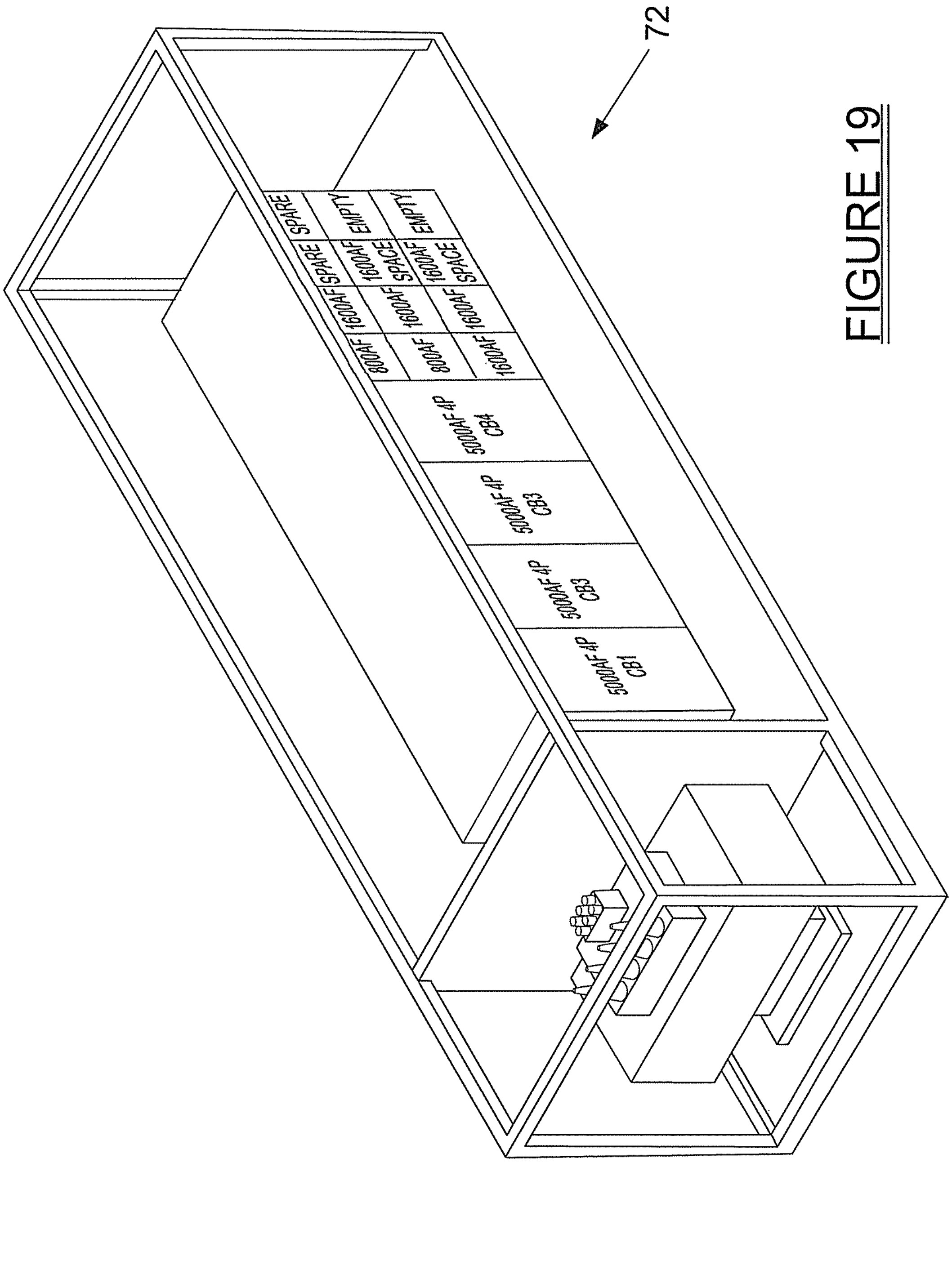
FIG. 19 illustrates a modular power supply unit for constructing the power hall shown in FIG. 18.
Figure 20:
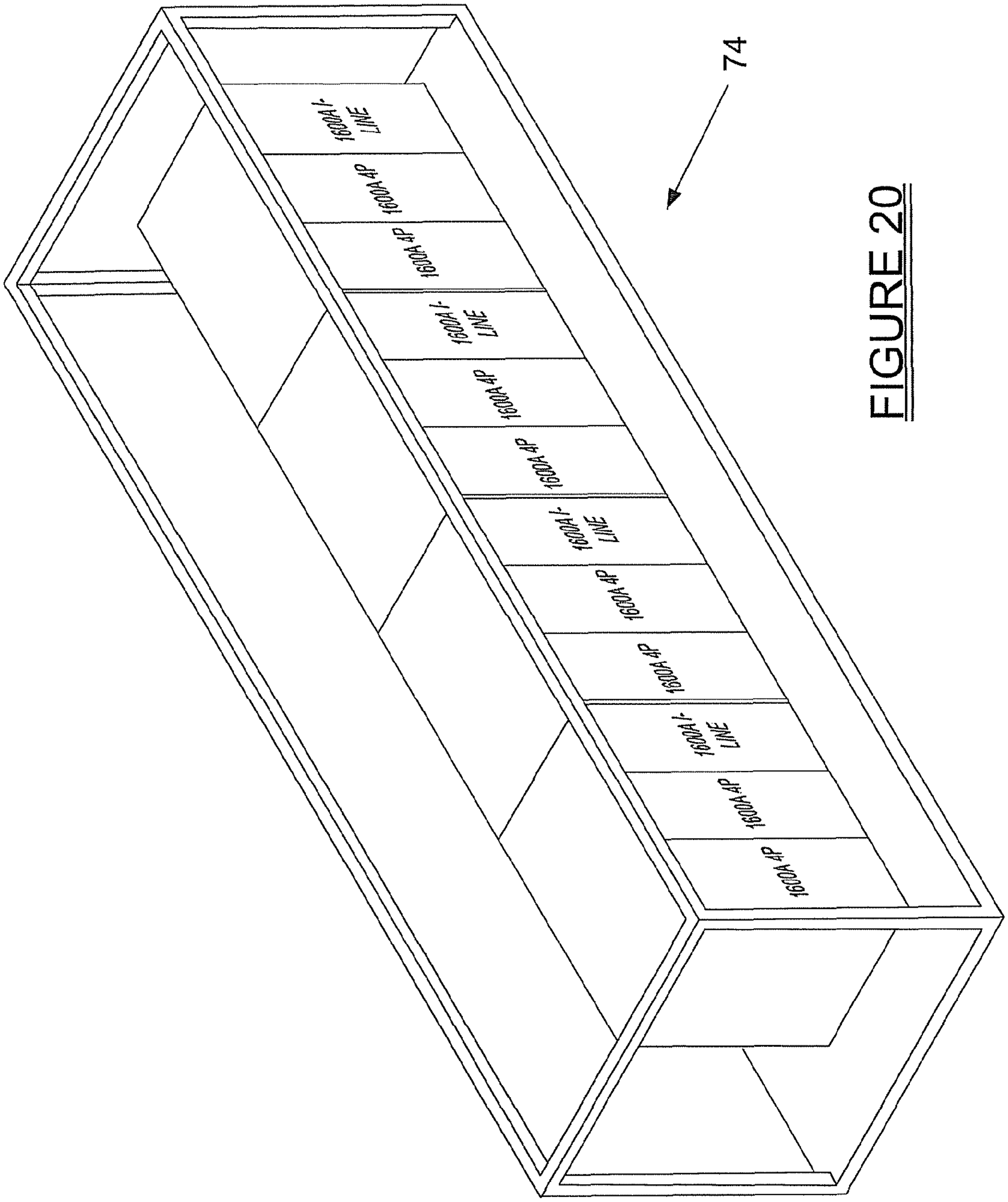
FIG. 20 illustrates a modular power cabinet unit for use in constructing the power hall shown in FIG. 18.

FIG. 18 illustrates one embodiment of a modular "power hall" 70 that may be used in connection with the unit structures 12 to form the modular data center facility 10. With additional reference to FIGS. 19-22, the modular power hall 70 may be made up of one or more modular power supply units 72 (FIG. 19), one or more modular power cabinet units 74 (FIG. 20), one or more modular UPS (uninterruptible power supply) units 76 and one or more modular PDU (power distribution unit) units 78, as well as any other type of power component or subsystem. FIG. 18 also shows a plurality of electrical bus bars 80 that may be used to connect the various components in each of the modular units 72-78 as needed to distribute power.

The modular power supply units 72 may each include a main bus, for example a 5000 A main bus for supplying 100 kA at 480V. A plurality of main breakers and distributed breakers may also be included along with a suitable power control system and a power quality meter.

The modular power cabinet units 74 may each include a 1600 A bus main bus for delivering 65 kA at 480V. Power breakers and distribution breakers may be configured as needed for specific applications.

The modular UPS units 76 may each include parallel 400 kVA/400 kW modules to provide 750 kW of backup power. However, it will be appreciated that the UPS units 76 may be configured as needed to suit a specific application.

Each of the modular PDU units 78 may be configured to provide 300 kVA 480/208/120V, or a different selected electrical output. Load distribution breakers may also be mounted in cabinets (not shown) that are in turn mounted to the sides of a frame of each PDU contained in the modular PDU unit 78.

Each of the modular units 72-78 may have similar or identical dimensions. In one embodiment the dimensions of the modular units 72-78 are identical with a length of 12192 mm (40 feet), a width of 3658 mm (12 feet) and a height of 3500 mm (11 feet and 5.8 inches). Obviously these dimensions may be varied slightly if needed. In this example, the modular units 72-78 may have length and width dimensions that are the same as the unit structures 12. These dimensions enable shipping of the modular units 72-78 in conventional shipping containers.

Figure 21:
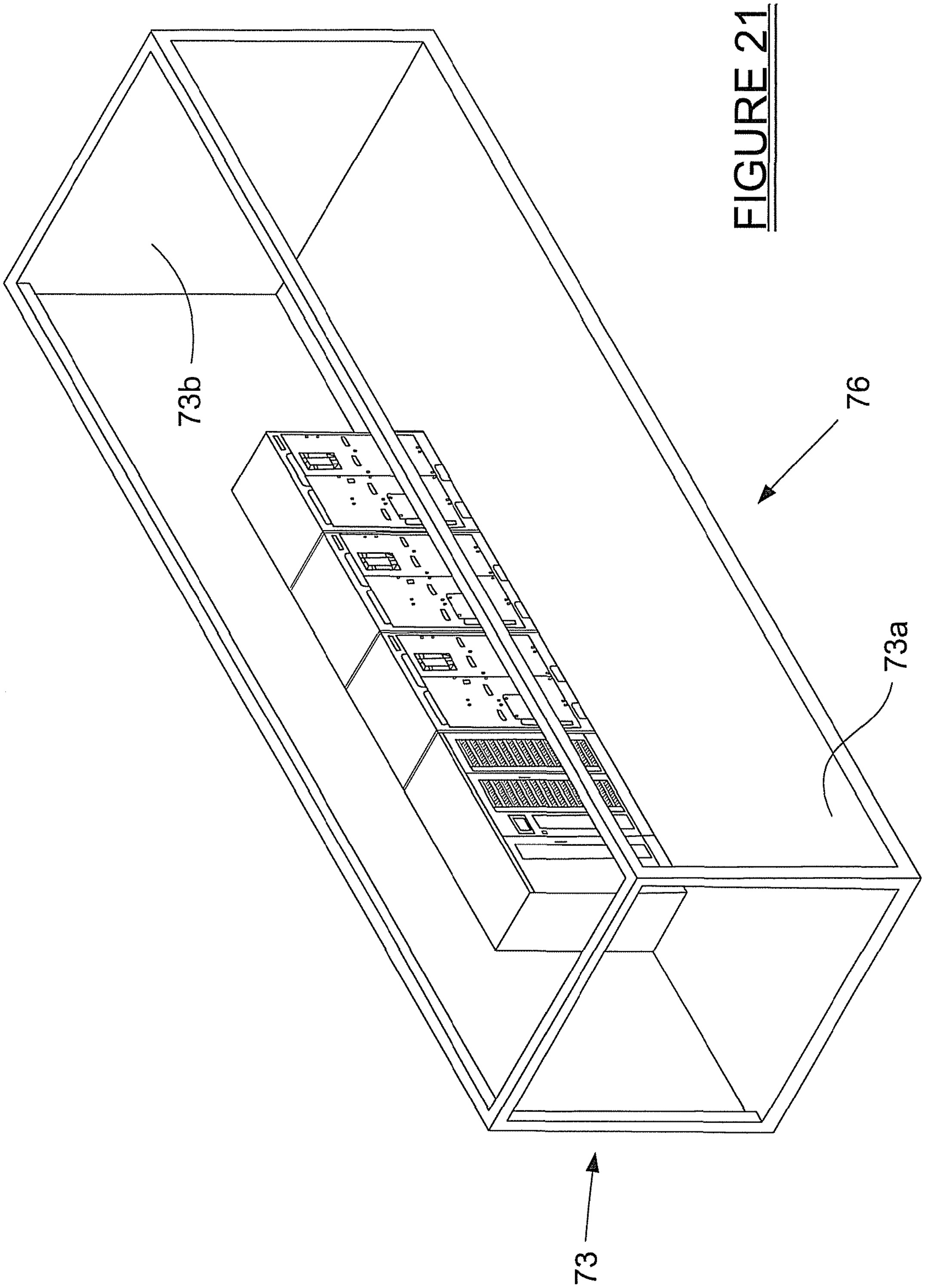
FIG. 21 shows a modular UPS unit for use in constructing the power hall shown in FIG. 18.
Figure 22:
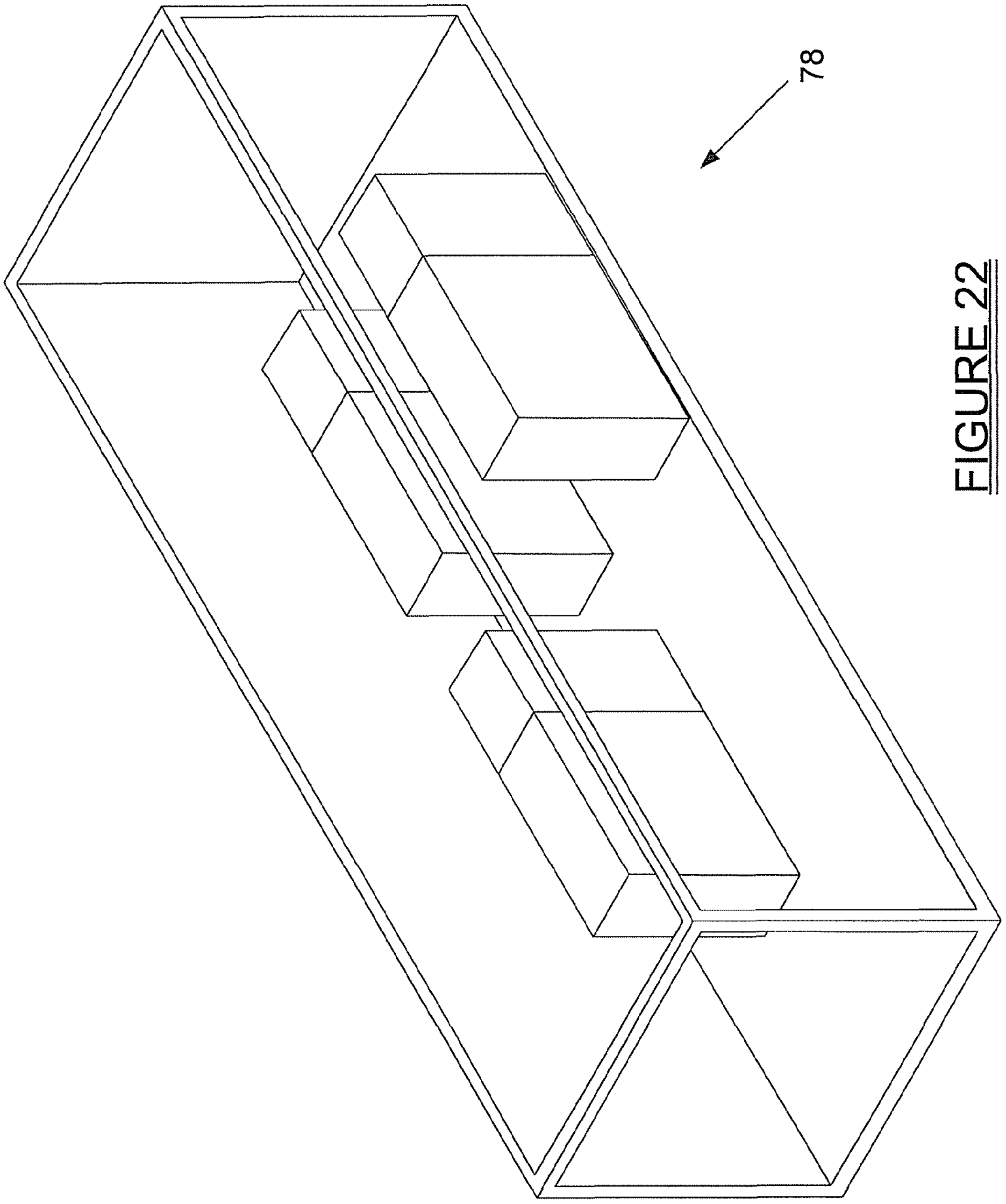
FIG. 22 shows a modular PDU unit for use in constructing the power hall shown in FIG. 18.

With brief reference to FIG. 21, each of the modular units 72-78 may include a frame structure 73 having one or more of components secured thereto such as a floor **73*a* and one or more wall portions 73*b*. The modular units 72-78 are also rapidly deployable when they are received at the destination site. The modular configuration of the units 72-78 allows for easily expanding the power supply capabilities of the power hall 70** as data center needs grow.

Figure 23:
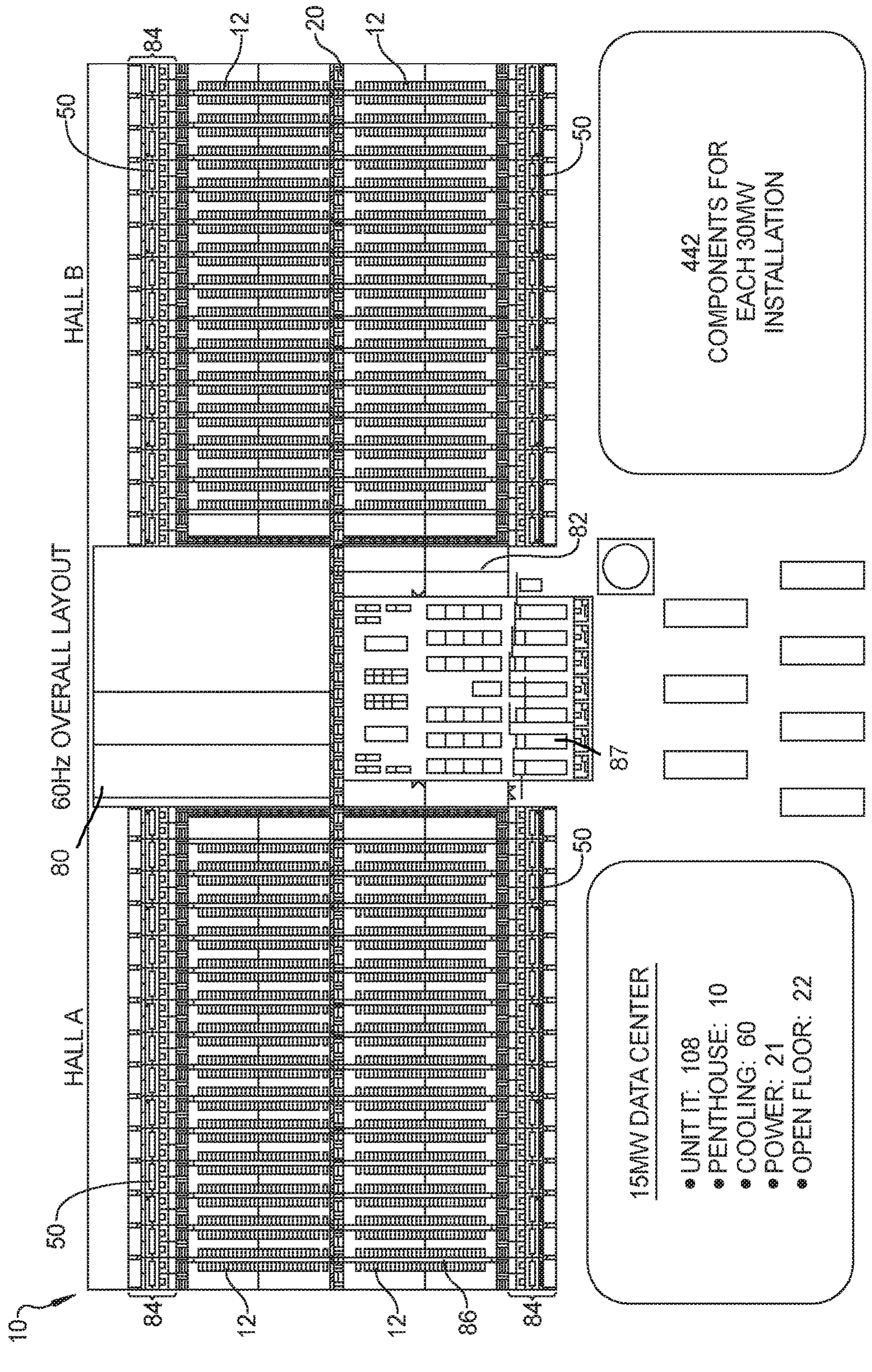
FIG. 23 is an overhead view of one exemplary layout for a data center that makes use of two halls separated by a modular office/storage area and a modular water treatment unit.

FIG. 23 shows an overhead view of one example of an implementation of the modular data center facility 10. The unit structures 12 are grouped into two halls, "Hall A" and "Hall B", separated by a modular office/storage section area 80. A modular water treatment section 82 may include water treatment equipment. Rows 84 of modular cooling units 50 may be arranged adjacent the rows of unit structures 12. A row of modular penthouse exhaust structures 20 (not shown in FIG. 23) may extend over a hallway area 86, perpendicularly to the unit structures 12, to interface with the hot aisles 17 adjacent the unit structures 12. A modular room 87 may be included for other data center or office equipment.

Figure 24:
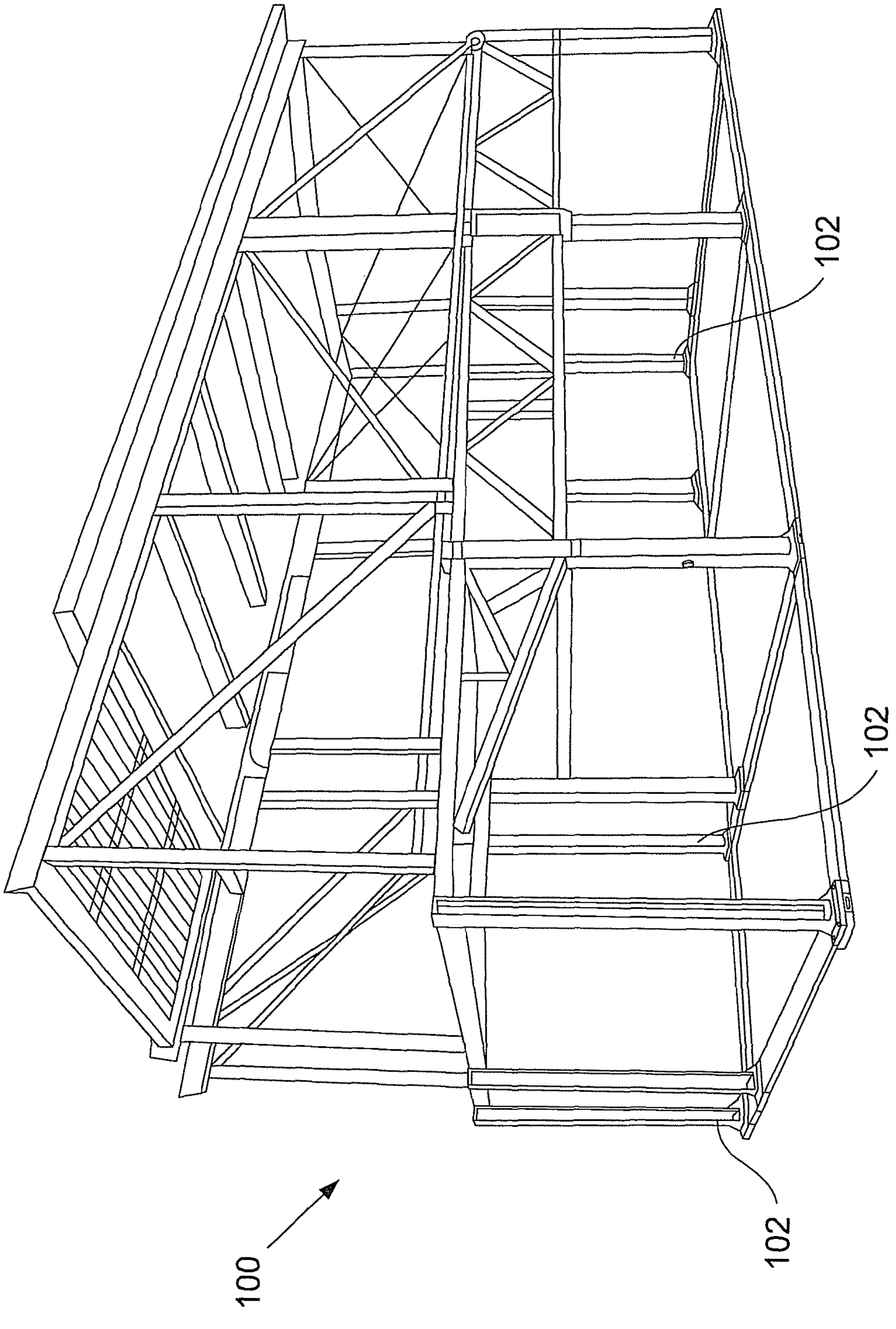
FIG. 24 is a perspective view of another embodiment of the unit structure.

Referring to FIG. 24, a unit structure 100 is shown in accordance with another embodiment of the present disclosure. The unit structure 100 is this example also has additional structural columns 102 that may be used to help form a hot aisle with one or more doors at opposing ends of the unit structure 100.

Figure 25:
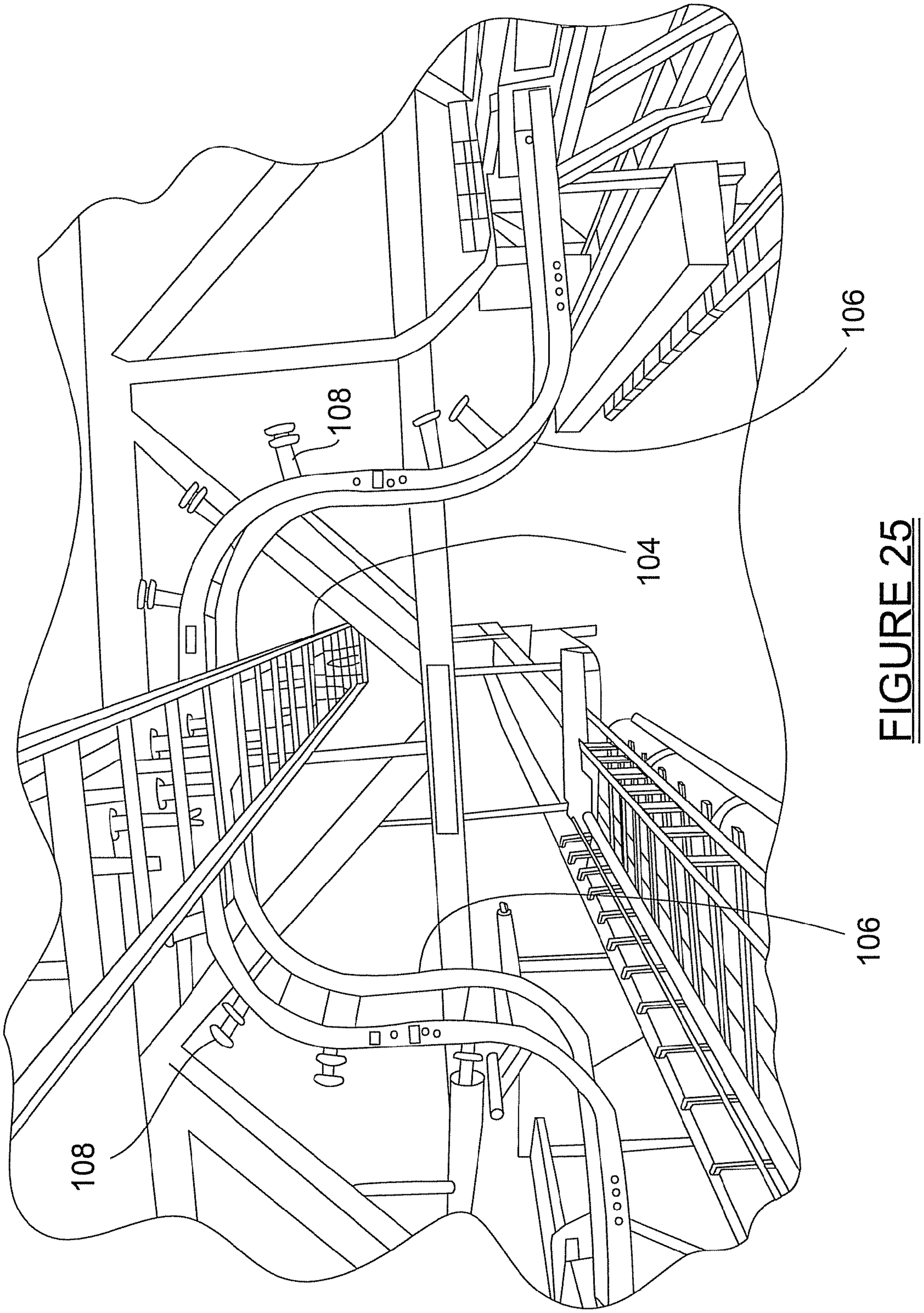
FIG. 25 is a perspective view of a portion of the unit structure of FIG. 24 illustrating a centrally located cable tray.

The unit structure 100 can also be seen in FIG. 25 to include a central, elongated tray 104 that runs a substantial portion of a full length of the unit structure 100. The central, elongated tray 104 may include a pair of curving tray portions 106 that enable cables to be fed out from the central, elongated tray 104. The central, elongated tray 104 and the curving tray portions 106 may each include a plurality of posts 108 to help retain cables within the trays 104 and 106.

It will be appreciated that the various embodiments of the present disclosure may incorporate built in lighting fixtures, as well as one or more lengths of built in conduit for the delivery of water or a different fire suppression agent. The cable trays 38, 40 and 104 may be used to divide and route specific types of cabling (i.e., optical, power, network, etc.) depending on user requirements or preferences.

Figure 26:
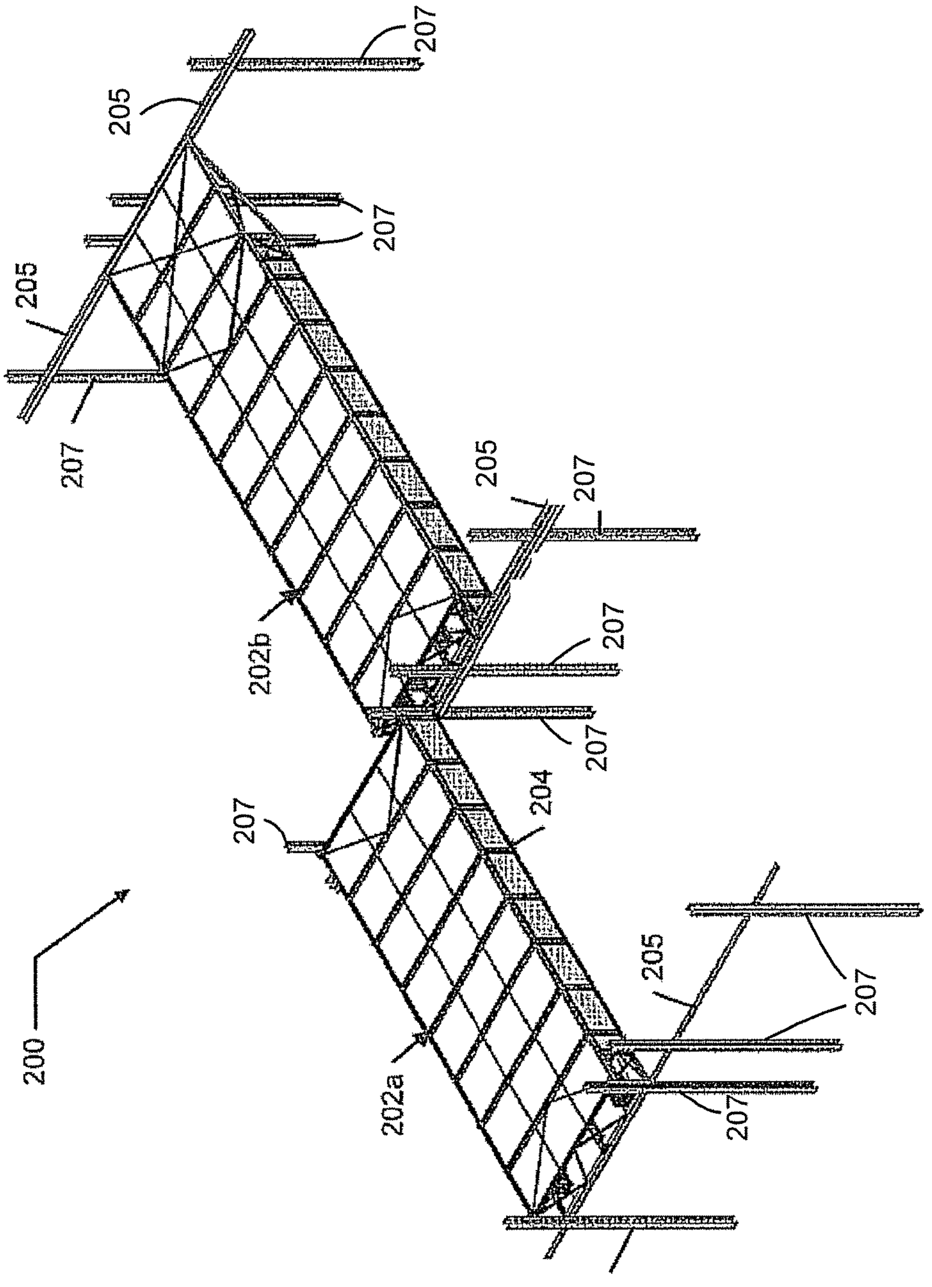
FIG. 26 is a perspective view of a portion of a modular data center system in which a plurality of unit structures can be rolled along horizontal support rails into a desired position when the data center is being constructed.

Referring to FIG. 26, a modular data center system 200 is shown in simplified form. The system 200 may be modularly expanded as described with the system 10 of FIG. 1 to form a data center of virtually any dimensions. The system 200 is similar to the system 10, but in FIG. 26 only two unit structures 202*a* and 202*b* are shown. The unit structures 202*a*/202*b* are similar to unit structures 12, and each unit structure 202*a*/202*b* includes a perimeter frame structure 204. With a typical modern day data center, dozens or even hundreds or more unit structures 202*a*/202*b* may be employed in an X-Y grid of rows and columns to form a large, modular data center, as more typically shown in FIGS. 18 and 23.

The unit structures 202*a*/202*b* are supported on horizontally arranged elongated support rails 205. The support rails 205 are supported above a floor surface by support columns 207. The support rails 205 and support columns 207 are fixedly interconnected to form a rigid supporting structure having sufficient strength to support the unit structures 202*a*/202*b* at a desired height above the floor surface. The support rails 205 may have any suitable cross sectional shape, but in this example are preferably of an L-shape when viewed in cross section. An L-shape is especially works especially well to provide structural strength while allowing rolling movement of the unit structures 202*a*/202*b* thereon.

Figure 27A:
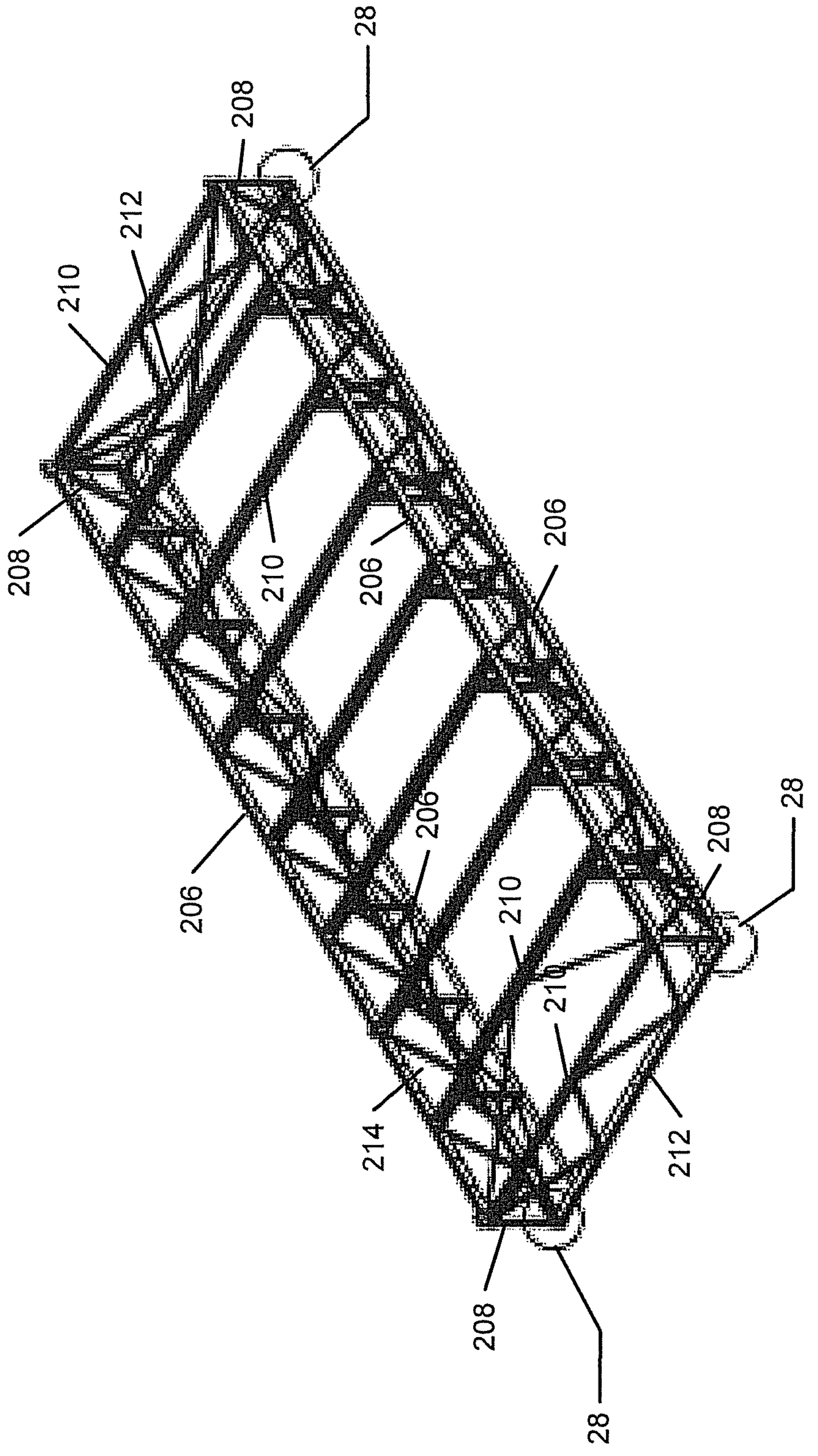
FIG. 27*a* is a perspective view of a first one of the unit structures indicating that the carriage assemblies are arranged at the four corners thereof.
Figure 27B:
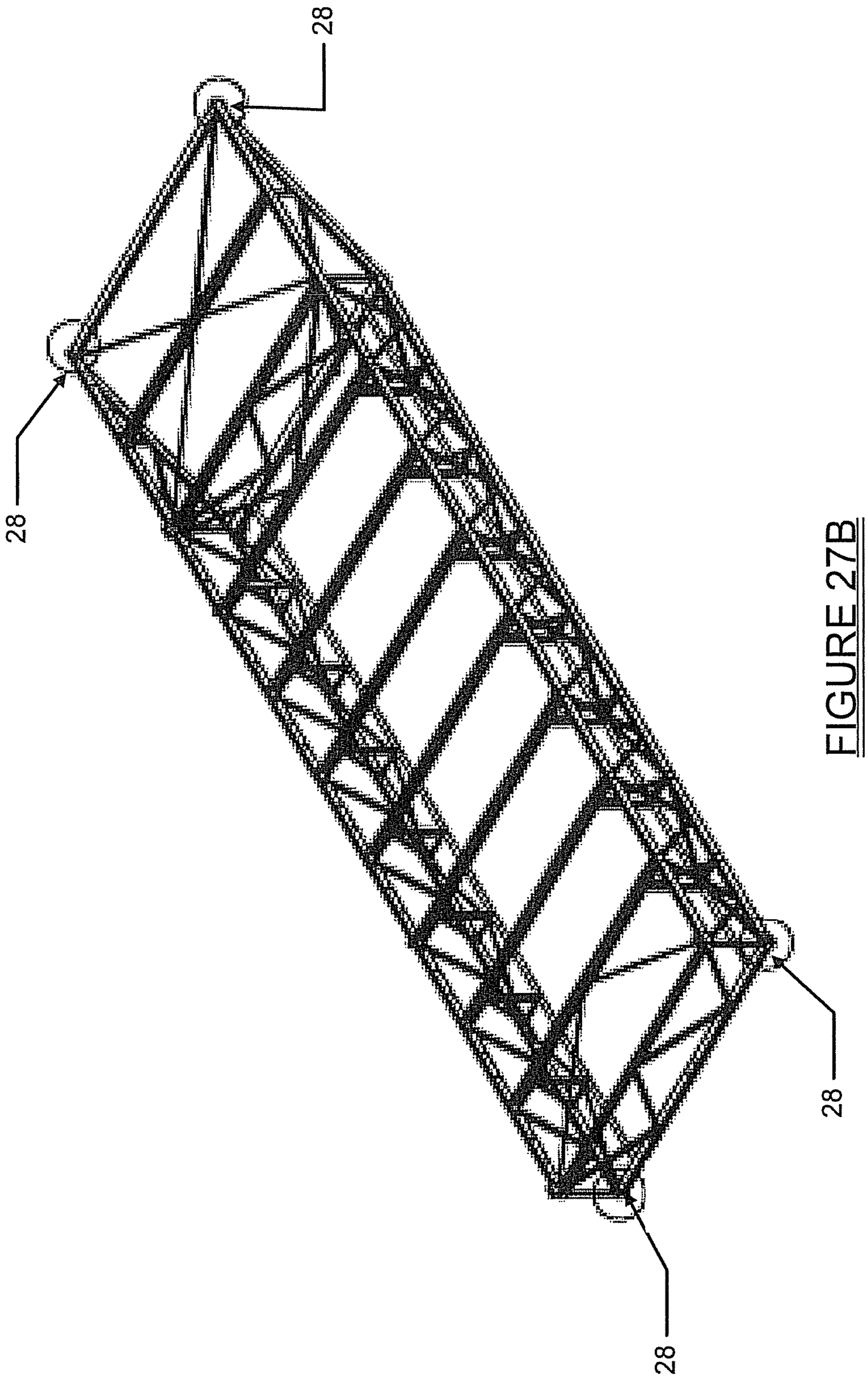
FIG. 27*b* is a perspective view of a second one of the unit structures also indicating that the carriage assemblies are arranged at the four corners thereof.

Referring to FIG. 27*a*, the perimeter frame structure 204 of unit structure 202*a* is shown in greater detail. The unit structures 202*a* and 202*b* are similar in physical construction so only unit structure 202*a* will be described in detail. Unit structure 202*a* includes a plurality of frame rails 206, which may be of a square or rectangular cross sectional shape, which are all disposed parallel to one another. A plurality of frame elements 208 is disposed perpendicular to the frame rails 206 and located at the four corners of the unit structure 202*a*. A plurality of frame cross members 210 are disposed at each end of the unit structure 202*a*, and one inverted U-shaped frame track 212 is disposed at each end of the unit structure 202*a*. A plurality of cross bracing members 214 may also be incorporated for additional structural strength and rigidity. The components 206-214 may be fixedly interconnected such as by welding or possibly by threaded nut and bolt construction to form a highly rigid frame structure. With brief reference to FIG. 27*b*, the carriage assemblies 216 are similarly positioned at each of the four corners of the perimeter frame structure 204 of the unit structure 202*b*.

Figure 28:
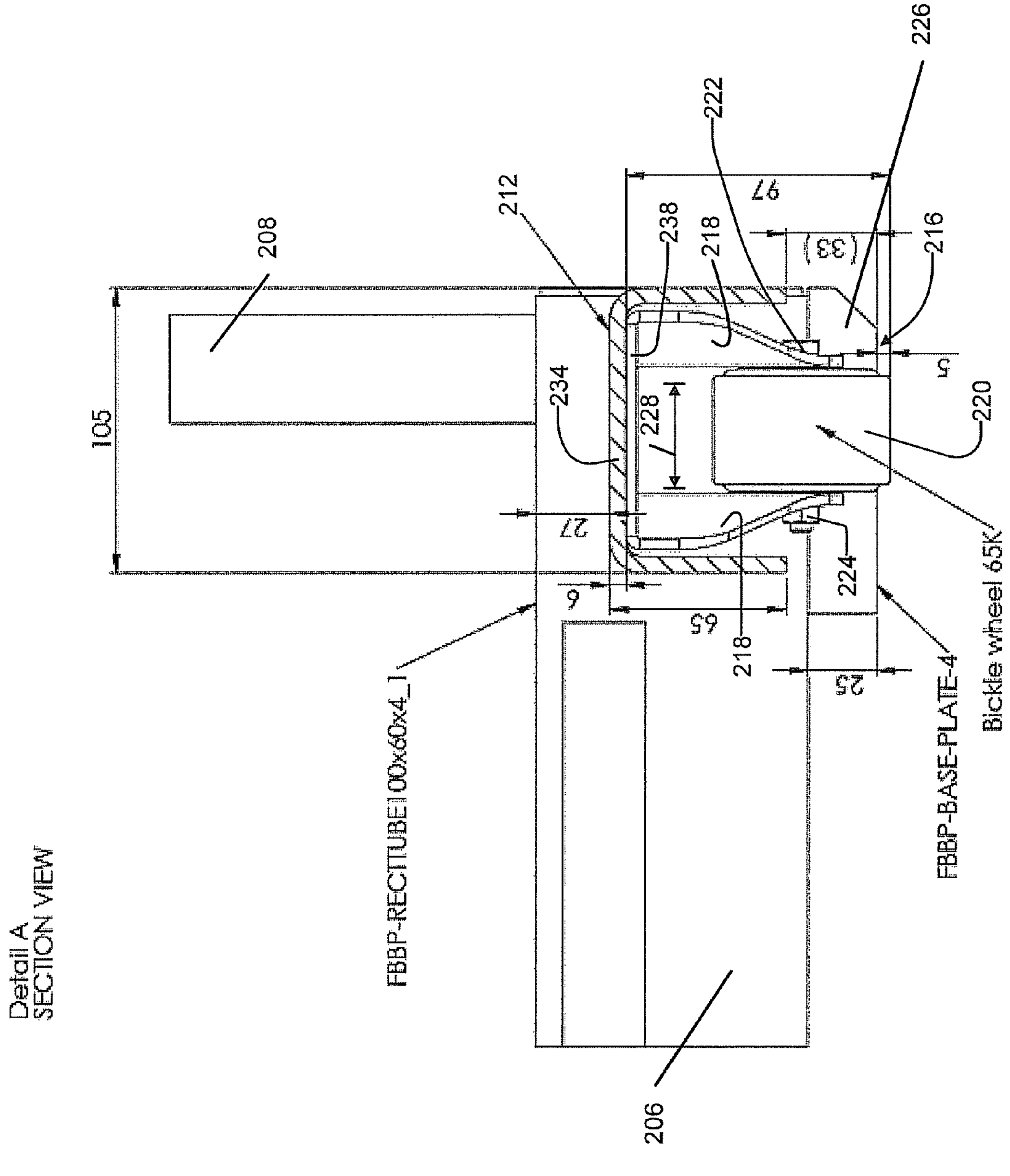
FIG. 28 is a cross sectional end view of one of the carriage assemblies, as indicated by circled areas 28 in FIGS. 27*a* and 27*b;*

Referring to FIG. 28, the areas indicated by circled areas 28 in FIG. 27 are shown in greater detail in the partial cross sectional illustration of FIG. 28. At each of the four corners of the unit structure 202*a* is a carriage assembly 216. The carriage assembly 216 includes an inverted, U-shaped wheel mounting bracket 218, a wheel 220 supported on a suitable bearing (not shown), a threaded bolt 222 and a nut 224. In this view a base plate 226 is also shown which limits rolling movement of the wheel 220 in one direction, and which will be described further in the following paragraphs. A portion of the frame rail 206 may be notched out to receive the inverted U-shaped frame track 212 perpendicularly to the frame rail 206.

The wheel 220 may be made from steel or a polymer material suitable for supporting the weight of the unit structure 202*a* while still allowing relatively easy rolling movement of the unit structure. Wheels suitable for this purpose are commercially available from various manufacturers, for example Blickle U.S.A. Wheels and Casters, Inc. of Charlotte, N.C. The diameter of the wheel may vary considerably. The thickness of the wheel, as indicated by dimension arrow 228, in one example may be about 40 mm.

Figure 30:
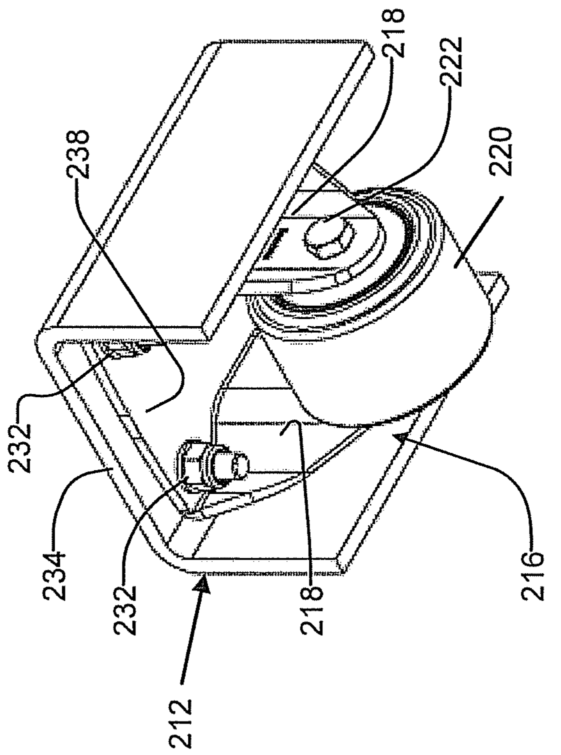
FIG. 30 is bottom perspective view of the carriage assembly of FIG. 29.
Figure 29:
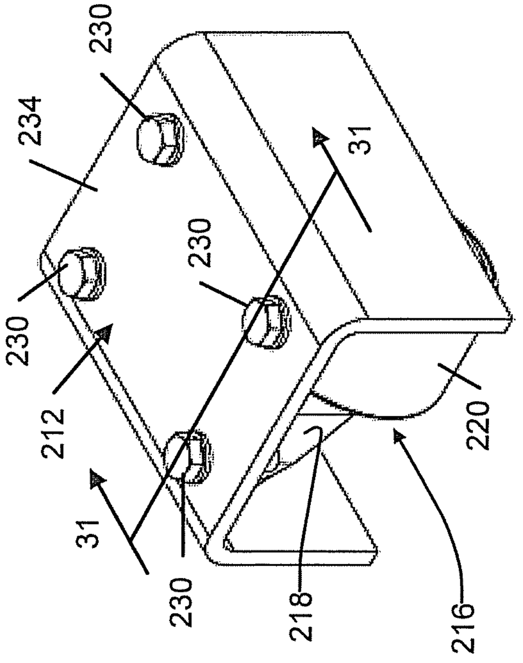
FIG. 29 is a top perspective view of a portion of one of the inverted U-shaped support rails and one of the carriage assemblies.

Referring to FIGS. 29 and 30, the attachment of the inverted U-shaped wheel mounting bracket 218 to a portion of the inverted U-shaped frame track 212 is shown. In this example a plurality of threaded bolts 230 are used along with threaded nuts 232. The threaded bolts extend through holes (not visible) in an upper surface 234 in the inverted U-shaped frame track 212.

Figures 31, 32:
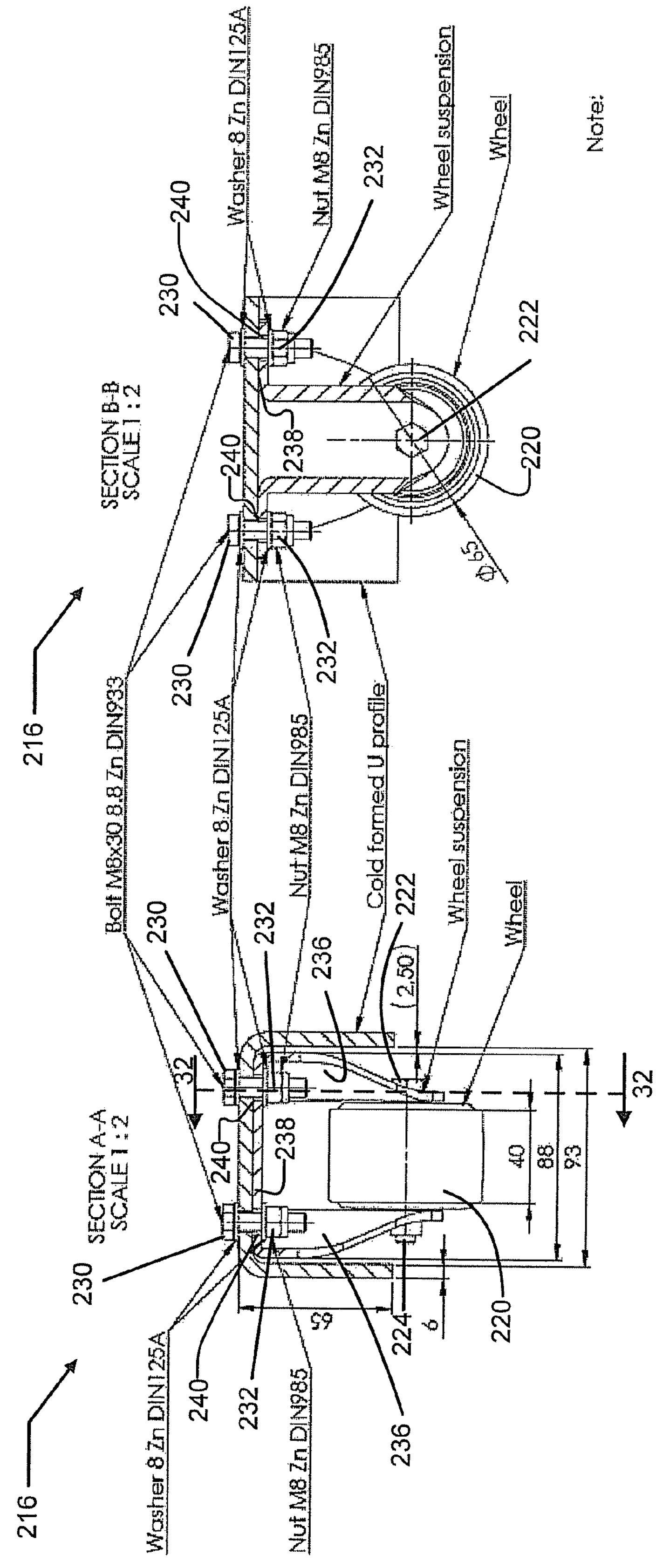
FIG. 31 is a cross sectional end view of one of the carriage assemblies taken in accordance with section line 31-31 in FIG. 29.
FIG. 32 is a cross sectional side view of the carriage assembly of FIG. 31 taken in accordance with section line 32-32 in FIG. 31.

FIGS. 31 and 32 show the carriage assembly 216, and particularly the inverted U-shaped wheel mounting bracket 218, in greater detail. The inverted U-shaped wheel mounting bracket 218 includes sidewall portions 236 which flare outwardly slightly, and an upper wall 238. The upper wall 238 includes holes 240 through which the threaded bolts 230 extend. The threaded bolts 230 have a length sufficient to enable the threaded nuts 232 to be attached thereto but not so long as to interfere with rolling movement of the wheel 220.

Figure 33:
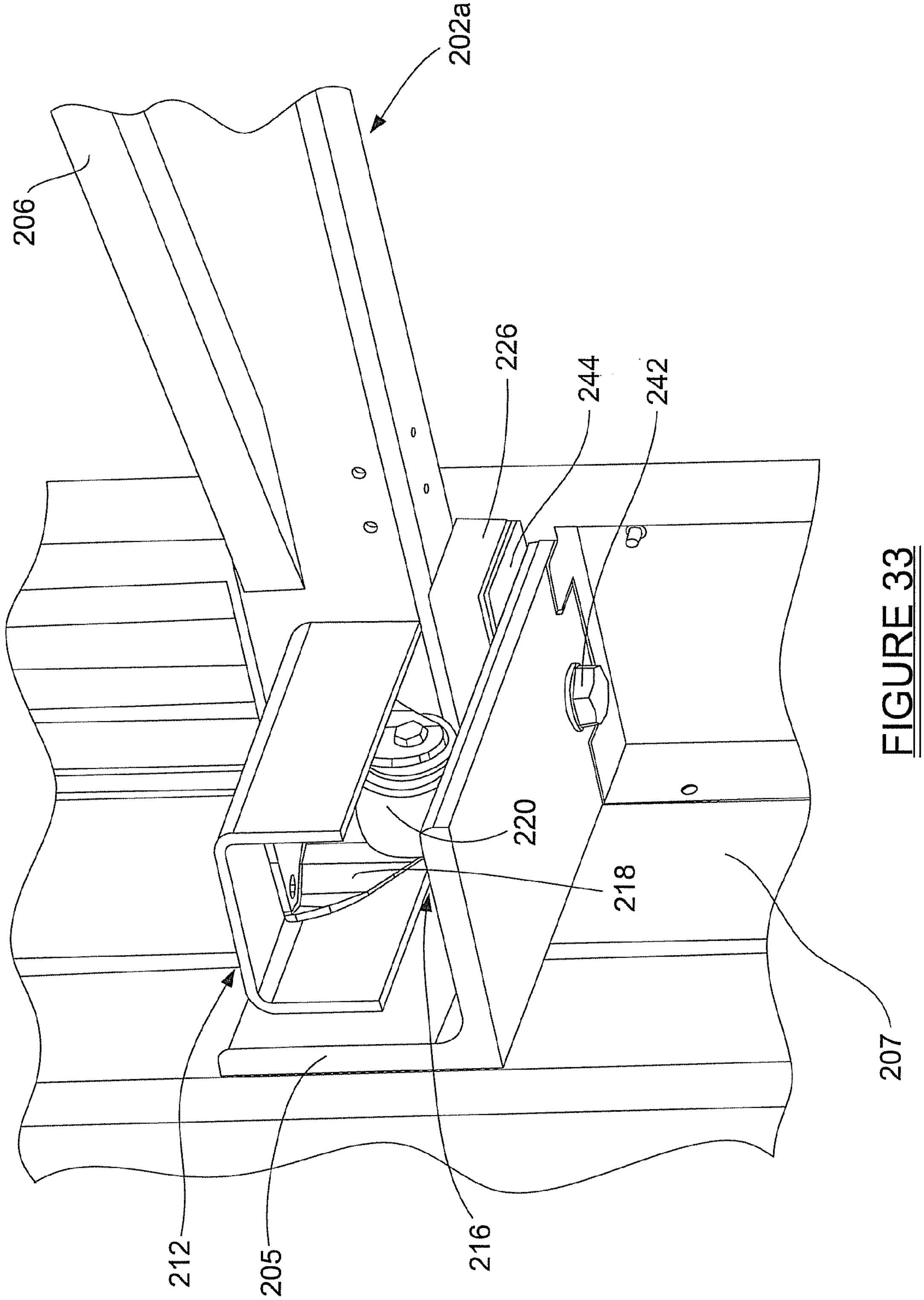
FIG. 33 is a perspective view of one of the carriage assemblies showing the wheel thereof positioned on one of the horizontal support rails and abutting the base plate.

FIG. 33 shows one of the carriage assemblies 216 positioned on the support rail 205. The base plate 226 for stopping rolling movement of the wheel 220 on the support rail 205 is also shown. The base plate 226 may be a metallic or high strength plastic block of material that is secured via a threaded nut 242. One or more metallic or plastic shim plates 244 may be used to adjust a height at which the base plate 226 sits to help provide a positive stopping action while still allowing clearance for the frame rail 206 of the unit structure 202*a*. It will be appreciated that the dimensions of the support rails 205, as well as the lateral spacing of each pair of the support rails 205, are selected to allow unimpeded movement of the inverted U-shaped frame track 212 along the support rails 205 while the unit structure 202*a* is being rolled into a desired position.

The modular data system 200 thus enables a plurality of unit structures 200 to be rolled into place on the support rails 205 using a suitable winch. This significantly expedites assembly of a modular data center. Since the unit structures 202*a*/202*b* may be loaded at one end of the support rails 205 and then rolled along the support rails 205 to their final designated positions, there is no need to individually assembly the unit structures themselves at the work site.

The various embodiments of the modular data center facility 10 and the system 200 enable the various modular components that are used to form the data center to be easily shipped to a destination site and constructed in a desired configuration. The modular components the data center facility 10 can be rapidly deployed so that a fully functioning data center can be constructed much more quickly than a conventional "stick built" data center structure.

While various embodiments have been described, those skilled in the art will recognize modifications or variations which might be made without departing from the present disclosure. Any dimensions given on the drawings hereof are intended to be merely examples of suitable dimensions, and such may be modified as needed to meet the needs of specific applications. The examples illustrate the various embodiments and are not intended to limit the present disclosure. Therefore, the description and claims should be interpreted liberally with only such limitation as is necessary in view of the pertinent prior art.

What is claimed is:

1. A modular data center system, comprising:

a plurality of unit structures for channeling at least one of cold air or hot air from data center components located within the modular data center system when the modular data center system is fully assembled;

a plurality of structural support columns independent from a plurality of equipment racks for supporting the plurality of unit structures above the plurality of equipment racks at a desired height relative to a floor surface;

a plurality of elongated support rails, coupled perpendicularly to the plurality of structural support columns at the desired height, to form a plurality of parallel, horizontal, spaced apart tracks, the plurality of structural support columns and the plurality of elongated support rails being fixedly interconnected to form a rigid supporting structure, the plurality of unit structures are installed on the rigid supporting structure, co-planar to one another and in a grid formation extending in both X and Y perpendicular directions;

each of the unit structures including a plurality of carriage assemblies, each of the carriage assemblies including a wheel; and wherein the wheels of the carriage assemblies allow the unit structures to be rolled horizontally into a desired position on the plurality of elongated support rails when constructing a modular data center building to expedite assembly of the modular data center building, and to enable at least a pair of the unit structures to be positioned in longitudinal alignment with one another along a common longitudinal axis.

2. The modular data center system of claim 1, wherein each one of said plurality of elongated frame rails comprises an elongated L-shaped support rail.

3. The modular data center system of claim 1, wherein each said unit structure includes a frame track for providing structural rigidity to its associated said unit structure and forming an integral portion of its associated said unit structure.

4. The modular data center system of claim 3, wherein each said carriage assembly includes:

one said wheel operatively secured to the frame track, the wheel configured to ride on an associated one of the plurality of elongated support rails to enable rolling movement of its associated said unit structure while supporting the frame track above its associated said elongated support rail.

5. The modular data center system of claim 3, wherein the frame track comprises a generally inverted U-shaped frame track.

6. The modular data center system of claim 5, wherein each said carriage assembly further comprise an inverted U-shaped wheel mounting bracket for mounting its associated said wheel to the inverted U-shaped frame track.

7. The modular data center system of claim 1, further comprising at least one base plate secured to one of the elongated support rails for limiting rolling movement of at least one said wheel of at least one said carriage assembly along an associated one of the elongated support rails.

8. The modular data center system of 1, wherein each one of the unit structures includes four of the carriage assemblies.

9. A modular data center system, comprising:

a plurality of unit structures for channeling at least one of cold air or hot air from data center components located within the modular data center system when the modular data center system is fully assembled;

a plurality of structural support columns independent from a plurality of equipment racks for supporting the plurality of unit structures above the plurality of equipment racks at a desired height relative to a floor surface;

a plurality of elongated support rails, coupled perpendicularly to the plurality of structural support columns at the desired height, to form a plurality of parallel, horizontally spaced apart tracks, the plurality of structural support columns and the plurality of elongated support rails being fixedly interconnected to form a rigid supporting structure;

the plurality of unit structures are installed on the rigid supporting structure, co-planar to one another and in a grid formation extending in both X and Y perpendicular directions;

each said unit structure including:

a plurality of carriage assemblies, each said carriage assembly including a wheel and being configured such that the wheels of the carriage assemblies are positioned adjacent each one of four corners of the unit structure; and wherein the wheels of the carriage assemblies enable the unit structures to be rolled horizontally into a desired position on the plurality of elongated support rails when constructing a modular data center building, and to enable the unit structures to be positioned in longitudinal alignment with one another along a common longitudinal axis.

10. The system of claim 9, wherein each one of the elongated support rails comprises an L-shaped rail.

11. The system of claim 9, wherein each of the unit structures includes a pair of frame tracks which form an integrated, structural portion of each of the unit structures.

12. The system of claim 11, wherein each one of the frame tracks comprises an inverted U-shaped frame track.

13. The system of claim 11, wherein each said carriage assembly comprises:

one of the wheels which is operatively secured to an associated one of the frame tracks, the wheel configured to ride on an associated one of the pair of elongated support rails to enable rolling movement of its associated said unit structure while supporting said frame track above its associated said elongated support rail;

wherein the frame tracks of the unit structures are arranged parallel to one another; and wherein the carriage assemblies support the wheels adjacent four corners of the each of the unit structures.

14. The system of claim 9, wherein each of the carriage assemblies further comprise an inverted U-shaped wheel mounting bracket, each one of the wheel mounting brackets being operatively coupled to an associated one of the elongated support rails and operating to support its associated said wheel for rolling movement.

15. The system of claim 14, wherein first and second pairs of the wheel mounting brackets are disposed at opposite longitudinal ends of the frame tracks.

16. The system of claim 15, further comprising at least one base plate fixedly secured to one of the elongated support rails for limiting rolling movement of the wheels of the carriage assemblies.

17. A method for forming a modular data center, the method comprising:

providing a plurality of unit structures for channeling at least one of cold air or hot air from data center components located within the modular data center when the modular data center is fully assembled;

installing a plurality of first structural support columns independent from a plurality of equipment racks for supporting the plurality of unit structures above the plurality of equipment racks at a desired height relative to a floor surface;

installing a pair of elongated support rails, coupled perpendicularly to the plurality of first structural support columns at the desired height, to form two parallel, horizontal, spaced apart tracks, the plurality of structural support columns and the pair of elongated support rails being fixedly interconnected to form a rigid supporting structure;

installing the plurality of unit structures on the rigid supporting structure, co-planar to one another and in a grid formation extending in both X and Y perpendicular directions;

installing a plurality of carriage assemblies, each of the carriage assemblies including a wheel, to support each of the unit structures on the elongated support rails; and installing the wheels of the carriage assemblies to horizontally roll each of the unit structures along the elongated support rails into a desired position on the pair of elongated support rails when constructing the modular data center, and wherein the plurality of unit structures is able to be positioned in longitudinal alignment with one another and along a common longitudinal axis.

18. The method of claim 17, wherein the operation of using a plurality of carriage assemblies comprises using four carriage assemblies for each unit structure.

19. The method of claim 18, wherein the operation of using a plurality of carriage assemblies comprises using a separate wheel with each one of the carriage assemblies, with each of the wheels rolling on an associated one of the elongated support rails.

20. The method of claim 19, further comprising securing a base plate to one of the elongated support rails to stop rolling movement of one of the unit structures.

* * * * *